United States Patent [19]
Watson et al.

[11] Patent Number: 6,040,792
[45] Date of Patent: Mar. 21, 2000

[54] UNIVERSAL SERIAL BUS TO PARALLEL BUS SIGNAL CONVERTER AND METHOD OF CONVERSION

[75] Inventors: Lynn R. Watson; James E. Castleberry; David D. Luke; David C. Gilbert, all of Boise, Id.

[73] Assignee: In-System Design, Inc., Boise, Id.

[21] Appl. No.: 08/974,736

[22] Filed: Nov. 19, 1997

[51] Int. Cl.[7] ...................................................... H03M 9/00
[52] U.S. Cl. ............................................ 341/100; 395/891
[58] Field of Search ..................................... 341/100, 101, 341/106; 395/200.31, 200.48, 891, 282, 285

[56] References Cited

U.S. PATENT DOCUMENTS 5,663,721  9/1997  Rossi ........................................... 341/51
5,729,573  3/1998  Bailey et al. ............................. 375/222
5,838,926  11/1998  Yamagishi ............................ 395/200.79

OTHER PUBLICATIONS

Universal US3 Serial Bus, Universal Serial Bus Specification Version 1.0, Jan. 19, 1996.

*Primary Examiner*—Marc S. Hoff
*Assistant Examiner*—Peguy JeanPierre
*Attorney, Agent, or Firm*—Frank J. Dykas; Robert L. Shaver

[57] ABSTRACT

A serial to parallel port signal converter for interconnection between a hosts utilizing Uniform Serial Bus communications protocols and a peripheral device uses IEEE 1284 complaint communications protocol. The signal converter appears to the host as a fully compliant bi-directional USB device, and to the peripheral device as a fully compliant IEEE 1284 host.

21 Claims, 18 Drawing Sheets

UNIVERSAL SERIAL BUS TO PARALLEL BUS SIGNAL CONVERTER AND METHOD OF CONVERSION

BACKGROUND OF THE INVENTION

1. Technical Field

This invention generally relates to a signal converter for converting signals transmitted from a Universal Serial Bus conforming to standards, as implemented by the Universal Serial Bus Implementation Forum, to signals transmitted from a parallel port conforming to IEEE Standard 1284 and the reverse.

2. Background

Throughout its history, the computer and computer peripheral electronics industry has made a continuing effort to standardize input/output ports and signal or communication protocols. This has been, in large part, accomplished by adoption and adherence to industry standards such as those set forth by the Institute of Electrical and Electronic Engineers (IEEE).

A number of computer peripherals, including most printing devices, some paper and photograph scanners, and also some peripheral memory storage devices, are designed for interconnection to a host computer through the standard, and well known parallel port connector which conforms to the IEEE 1284 standard as adopted in the fall of 1994.

With printers, the typical information flow and processing steps can be demonstrated by simple example as follows: The document to be printed is first generated in the host computer using information processing application software, such as a word processing, or a spread sheet, program. The document, in the form of an electronic file of information, is then processed in a second software program, usually called a printer driver, where the information from the original application file is converted into a string of data bits which will ultimately be used by the printer to generate pixels in the complete dithered printed image. The printer driver software will perform such functions as scaling of pixels, addressing, adding color data, and often times even compressing the data in the event of redundant data.

This data stream is then passed through a third, lower level driver software application, usually the operating system software, where it is assembled into bytes suitable for transmission through the host computer's parallel port to the computer peripheral, which in this example is a printer. Over the years, a number of communication protocols have been developed for use in communication between the host computer and the printer peripheral. The earliest and simplest of these protocols is known as the compatibility mode protocol, in which data is sent from the host computer to the printer in one direction only, in eight bit, or one byte, parallel format. A more advanced version of compatibility mode includes what is known as the NIBBLE mode protocol which provides or allows specific information to flow back from the printer to the host computer over dedicated pins of the parallel port, four bits at a time, and enables the printer to report to the host computer status conditions.

Still later, the Extended Capabilities Port (ECP) protocol was developed wherein eight bits, one byte, of information can flow in either direction between the host computer and the peripheral printer. Another protocol, known as the Enhanced Parallel Port (EPP) protocol permits simultaneous transmission of a byte of information in both directions between the host computer and the printer.

The vast majority of printers of whatever type, make and manufacture, that are in use and are currently being manufactured in the United States, are for use with one or more of these communications protocols in conjunction with a parallel port conforming to the IEEE 1284 standard.

Other computer peripherals, including document scanners and peripheral memory storage devices, also utilize the parallel port conforming to the IEEE 1284 standard, and these communications protocols. However, because of the differing requirements, there may be additional protocols built into the peripheral driver resident in the host which are not standard in compatibility mode, enhanced capabilities port mode, or in the extended parallel port mode.

The Universal Serial Bus, USB, communication protocol is different in some fundamental areas, not the least of which is USB is a serial communications protocol, which is designed around shift registers. As a result, it is not possible to connect the input/output, I/O, USB port to a device designed to receive and transmit data through an I/O parallel port conforming to the IEEE 1284 standard. Accordingly, what is needed is a device which can be used to connect a USB ported host to a peripheral as a parallel ported, IEEE 1284 conforming, host. It is one object of this invention to provide a converter which can operate in an automatic mode as a fully compliant USB device receiving and sending data using USB communications protocols, and as a re-transmitting device sending and receiving data to an attached peripheral device as a fully compliant parallel port device, all done in a transparent manner wherein that the host need have no knowledge that the protocol translation is occurring.

It is another object of this invention to provide a signal converter which can operate in a register mode wherein the signal converter contains a set of registers which emulate those found in standard computer parallel port hardware.

SUMMARY OF THE INVENTION

These objects are accomplished in a serial to parallel port signal converter which is preferably manufactured as a one-chip serial to parallel port signal converter which converts a bit stream signal coming from the universal serial bus of a host device to a parallel signal conforming to the Institute of Electronic and Electrical Engineers (IEEE) 1284 signal protocol. It is connected to, and appears to a universal serial bus (USB) of a host, as a standard USB device, and to a peripheral device as an IEEE 1284 host. It operates in two different modes, the first being the automatic mode wherein it acts as a fully compliant bi-directional USB device receiving USB data packets and retransmitting that data to the attached peripheral device transparently as if it were an IEEE 1284 host. In automatic mode, the actual host device has no knowledge that the protocol translation is occurring.

In the second mode, register mode, the signal converter contains a set of registers which emulate those found in standard, IEEE compliant parallel port hardware.

The serial to parallel port signal converter can be understood representationally as a series of modules, the first being the universal serial bus device controller module which is connected to the universal device controller interface, a buffer memory, a read-only memory, and a parallel port interface module. The universal serial bus device controller is an application specific standard product developed by Sand Microelectronics, Inc., and available from Lucent Technologies and is known by the macrosell name of UDC as published in the Lucent Technologies System ASIC data book dated September, 1996. It functions as a controller for managing signals to and from the universal serial bus of the host, including generation and transmission of start codes, data strobes, and control and data signals. It handles most of the low level USB protocol operations and converts USB bit streams of data to a stream of bytes, plus control and status information. It is used to separate the cyclical redundancy check signal from the data, while it keeps the data in a register and verifies the accuracy of the cyclical redundancy check signal, and is used to send acknowledgment or non-acknowledgment signals to a universal device controller interface. The universal serial bus device controller also performs an additional function in that it stores the information about the end points of data streams and the devices supported by the serial to parallel port signal converter.

A universal device controller interface is provided and is utilized as a control device for the universal serial bus device controller, adding support for the USB protocol features not handled directly by the universal serial bus device controller. Some of these additional features include decoding of descriptor requests, and providing of descriptor data, which is sourced by the read-only memory by way of a buffer memory. It also provides support for all printer class device commands and support which is unique and specific to the present invention and not part of any standard specification. The universal device controller interface has ports for communicating to the buffer memory and also a port for communicating directly with the parallel port interface module.

A buffer memory is provided and is a block which has byte-oriented storage for multiple data packs, which in the preferred embodiment are packets of sixty-four (64) bytes. There are independent input and output channels for two packets of one hundred twenty eight (128) bytes of actual value in each direction.

The parallel port interface module is made of hardware for a fully automatic support of Institute of Electronic and Electrical Engineers (IEEE) 1284 standardized compatibility, NIBBLE, extended capability port and enhanced parallel port with and without run length encoded communications modes. It is intended to emulate normal parallel port hardware such as might be implemented with an industry standard super-I/O chip. It also includes logic to provide control for the automatic and register based parallel port logic, including readable and writeable registers which emulate those found in standard personal computers. It also includes necessary support logic, such as timers, counters, digital filters and post stretchers.

DESCRIPTION OF THE PREFERRED EMBODIMENT

Figure 1:
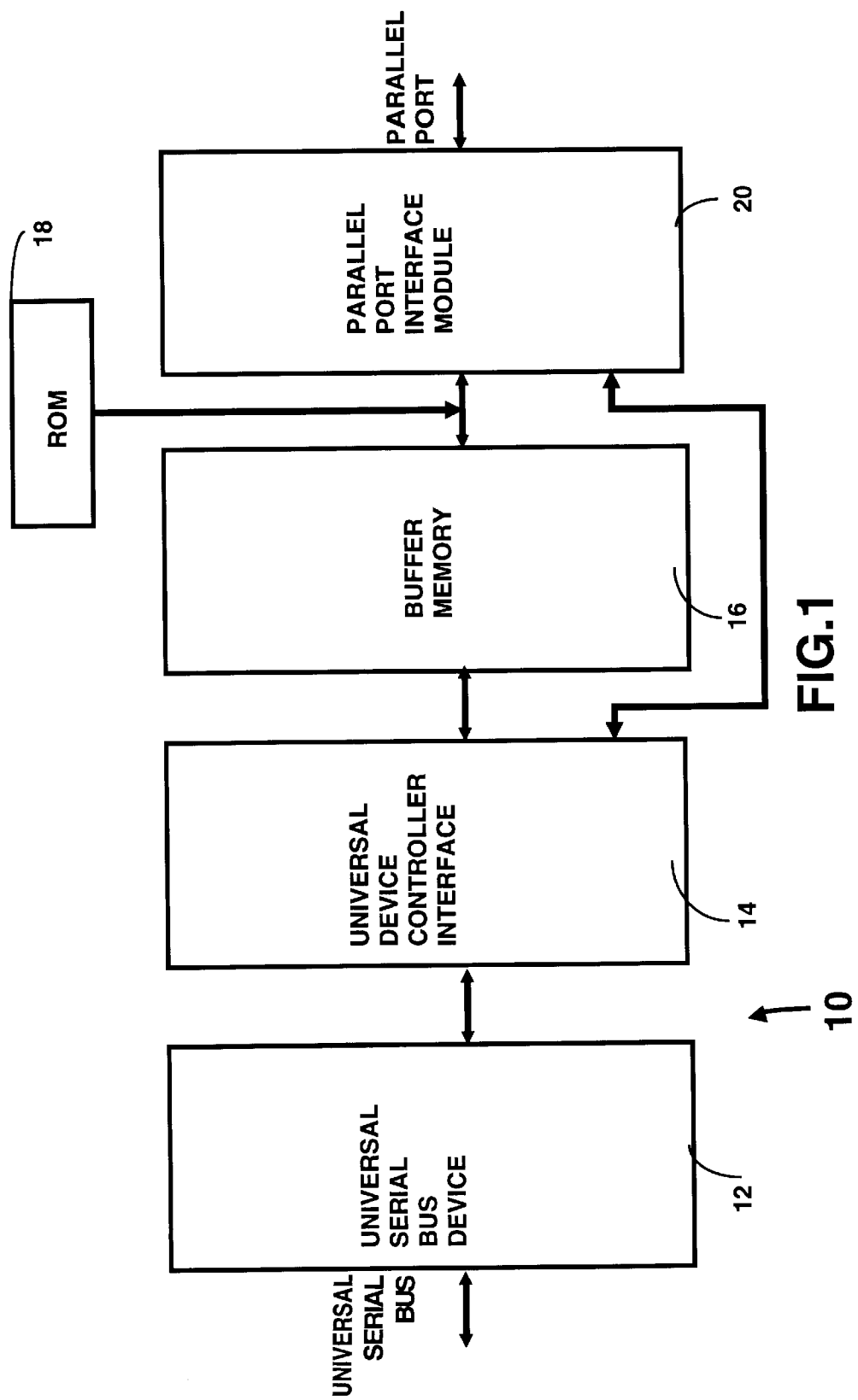
FIG. 1 is a high level block diagram of the serial bus to parallel bus signal converter.

The serial to parallel port signal converter 10 of the present invention is shown in a high-level block in FIG. 1. It is preferably manufactured as a one-chip serial to parallel port signal converter which converts a bit stream signal coming from the universal serial bus of a host device to a parallel signal conforming to Institute of Electronic and Electrical Engineers (IEEE 1284) signal protocol. It is connected to, and appears, to a universal serial bus of a host, hereinafter USB, as a standard USB device, and to a peripheral device as an IEEE 1284 host. It operates in two different modes, the first being the automatic mode, wherein it acts as a fully compliant bi-directional USB device receiving USB data packets and retransmitting that data to the attached peripheral device transparently as if it were a IEEE 1284 host. In automatic mode, the actual host device has no knowledge that the protocol translation is occurring.

In the second mode, register mode, the signal converter contains a set of registers which emulate those found in standard, IEEE 1284 compliant parallel port hardware.

As shown in FIG. 1, the serial to parallel port signal converter 10 can be shown representationally as a series of modules, the first being the universal serial bus device controller module 12 to which is connected the universal device controller interface 14, buffer memory 16, read only memory 18, and parallel port interface module 20. The universal serial bus device controller 12 is, in the preferred embodiment, an application specific standard product developed by Sand Microelectronics, Inc., and available from Lucent Technologies®, and is known by the MACROCELL name of UDC as published in the Lucent Technologies System ASIC Data Book dated September, 1996.

Universal serial bus device controller 12 is known in the prior art and its functions play no part of the present invention, except as a controller for a managing signals to and from the universal serial bus of the host in the manner which is hereinafter generally described.

Universal serial bus device controller 12 is used in the present invention to generally manage the USB data transmission, either to or from the host, including generation and transmission of start codes, data strobes and control and data signals. It handles most of the low level USB protocol operations and converts USB bit streams of data to a stream of bytes, plus control and status information. It is used to separate the cyclical redundancy check signal from the data, while it keeps the data in a register and verifies the accuracy of the cyclical redundancy check signal, and is used to send acknowledgment or non-acknowledgment signals to the universal device controller interface 14.

This is accomplished in the universal serial bus device controller 12 by a series of blocks, not shown in the diagrams, which include a phase lock loop for synchronizing the clock signals of universal serial bus device controller 12 and the entire serial to parallel port signal converter 10 to the clock signals of the host, and a serial interface engine which does the initial functions of the USB protocol: syncField identification, NRZI-NRZ conversion, token packet decoding, bit stripping, bit stuffing, NRZ-NRZI conversion, CRC5 checking and CRC 16 generation and checking. It also converts the serial packets from the USB signal to 8 bit parallel data. The universal serial bus device controller 12 also performs an additional function in the preferred embodiment, in that it stores the information about the end points and the devices supported by the serial to parallel port signal converter 10.

The universal device controller interface is utilized as a control device for the universal serial bus device controller, adding support for the USB protocol features not handled directly by the universal serial bus device controller 10. Some of these additional features include decoding of descriptor requests and providing of descriptor data, which is sourced by the ROM 18 by way provides support 16, and also provides support for all printer class device commands and support which is unique and specific to the present invention and not part of any standard specification. Universal device controller interface 14 has ports for communicating to the buffer memory and also a port for communicating directly with the parallel port interface module 20.

Buffer memory 16 is simply that, in that it is a block which has byte-oriented storage for multiple data packets, which in the preferred embodiment are packets of sixty four bytes. There are independent input and output channels, with buffering for two packets of 128 bytes of actual value in each direction.

Read only memory, ROM, 18 stores the specifications and information necessary to convert descriptor data from one communications protocol to another, as is hereinafter described.

The parallel port interface module 20 is made up of hardware for fully automatic support of Institute of Electrical and Electronic Engineers (IEEE) 1284 standardized compatibility, NIBBLE, extended capability port (ECP) and enhanced parallel port (EPP) with and without run length encoded (RLE) communications modes, and is intended to emulate normal parallel port hardware, such as might be implemented with an industry-standard super-I/O chip. It also includes logic to provide control for the automatic and register based parallel port logic, including readable and writeable registers which emulate those found in standard personal computers. It also includes necessary support logic such as timers, counters, digital filters and pulse stretchers, as is hereinafter described.

FIGS. 2A through 2D, a flow diagram, illustrate the actions taken in the universal device controller interface 14. In the first step, a data input is initiated in block 30 from the universal serial bus device controller 12, after which in decision block 32, a decision is made as to whether a data transfer has been initiated. If no data transfer is initiated, the universal device controller interface continues to wait for the initiation of a transfer, as is also shown in circle 31 of state transition diagram, FIG. 3.

Once a transfer is initiated, the transfer is decoded in Block 34 to identify the type of data being transmitted, as either being a command packet, in which case it is transferred to block 36, and interrupt request packet which is ported to block 38, or a data packet which is sent to block 40.

Figure 3:
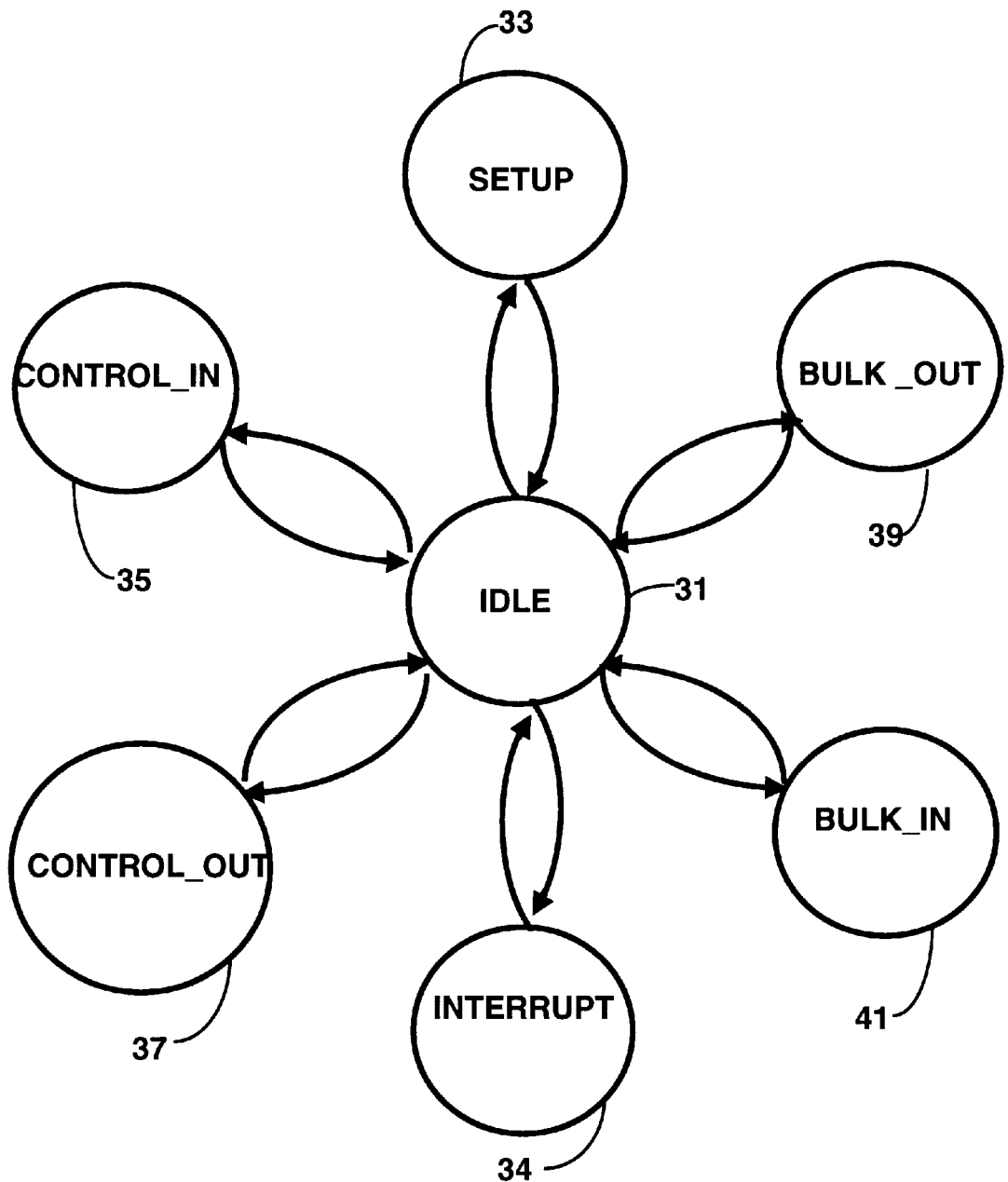
FIG. 3 is a state transition diagram for the universal device

As shown in FIG. 3, once a transfer is initiated, universal device controller 14 transitions to a set up state as shown in circle 31 wherein the data from the USB host coming from universal serial bus controller is loaded into an application bus. The completion of the receipt of data acknowledgment signal (ACK) or a not-acknowledged signal (NACK) transitions universal device controller interface 14 back to the idle state as shown in circle 31. If the data loaded during the set up, shown in circle 33, is a command packet, the universal device controller interface 14 transitions to the CONTROL_IN state as shown in circle 35 as the command is decoded. And its transfer is either acknowledged or not acknowledged. If it is not acknowledged, the universal device controller interface returns to idle state 31.

Figure 2:
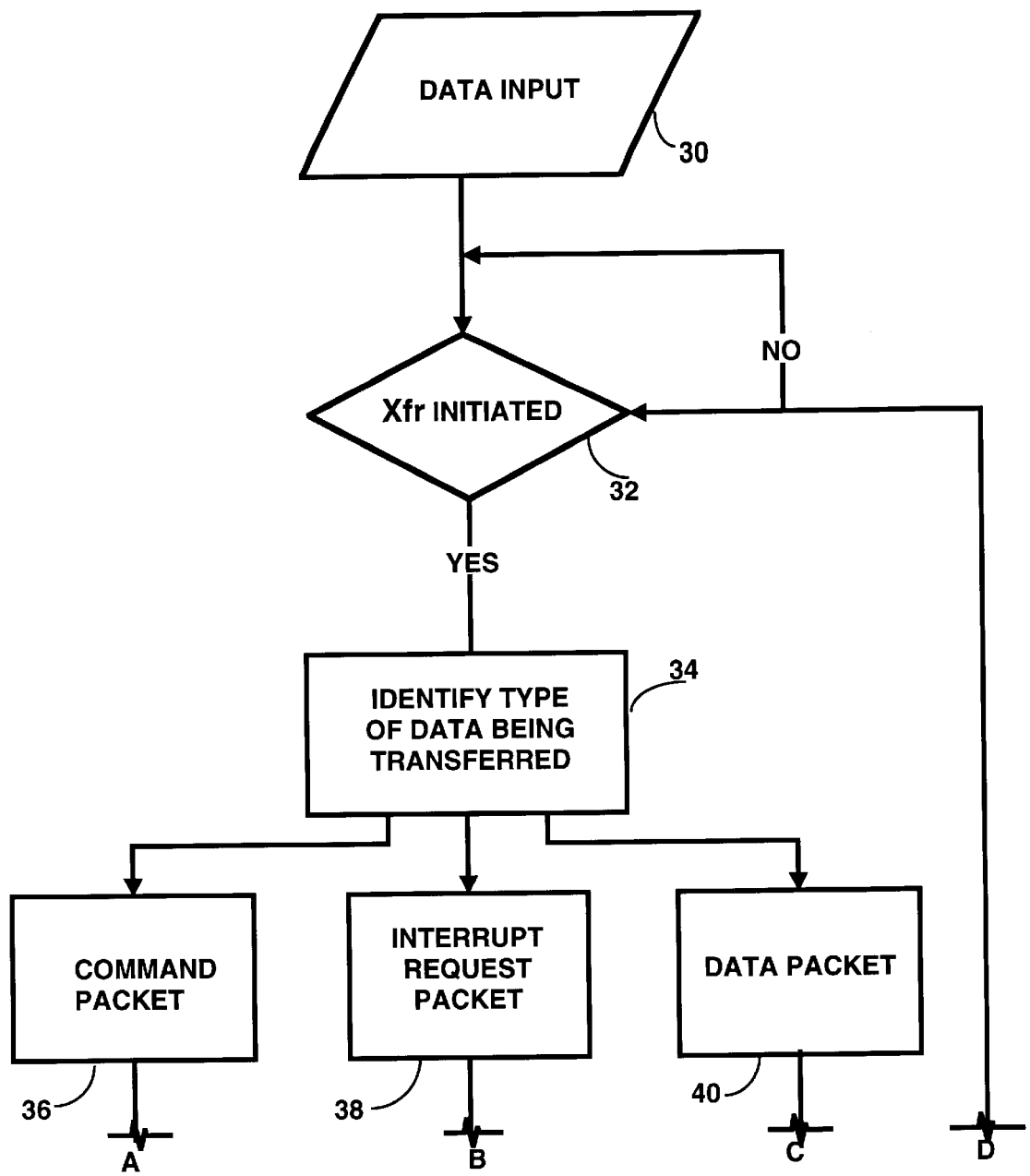
FIG. 2A through 2D is a flow chart block diagram of the universal device controller interface.
Figure 2B:
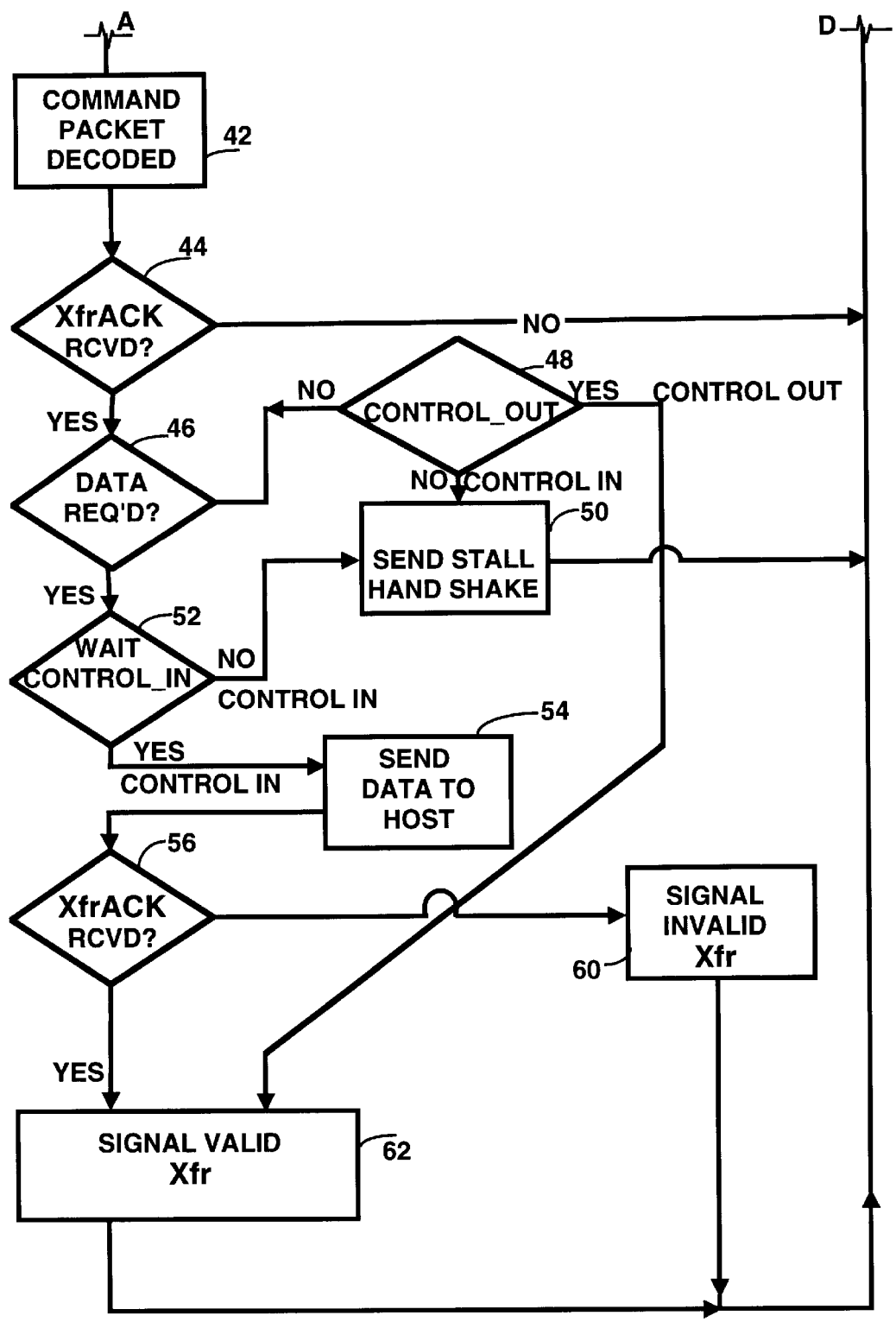

If the data is a command packet, as shown in FIG. 2B, the command packet is then decoded in block 42 and, in decision block 44, a decision is made as to whether it is a valid transfer of command packet data. In this decision block, an acknowledgment signal (ACK) or a not acknowledged signal (nACK) is received from the universal serial bus device controller, either acknowledging or not acknowledging the receipt of the valid cyclical redundancy check, (CRC) signal. If the decision is no, the proper acknowledgment has not been received, then the universal device controller interface resets to decision block 32 to await a valid transfer initiation.

If a valid acknowledgment is received, as determined by decision block 44, then a decision is made as to whether or not the command signal indicates that the host device requires that data be sent back to the host device regarding status information of the peripheral to which the parallel port interface module 20 is connected. This is also shown in the state transition diagram of FIG. 3 as state 37. If the answer is no, no status data is required, or no CONTROL_OUT transfer is received a decision is made in decision block 48, to send a stall handshake. If the decision is yes, and the signal has been received, then in block 62 a signal of a valid transfer is initiated back to the universal serial bus device controller 12. If the answer in decision block 48 is no, that is to say that a CONTROL_IN was not expected, then in box 50, there is sent a stall handshake back to the universal serial bus device controller 12 and the universal device controller transitions back to idle state shown as Circle 31 in FIG. 3.

If, as determined in decision box 46, data is required by the host, then, in decision box 52, the universal device controller interface 14 awaits for the receipt of a CONTROL_IN transfer indicating that the host is ready to receive the requested status data from the peripheral device as it transitions to the CONTROL_IN_state of circle 35 of FIG. 3. As shown in block 54, the data is sent to the host and the universal device controller interface 14 awaits, in decision block 56, an acknowledgment that the transfer was received by the host. If, in decision block 52, it is determined that no_CONTROL_IN transfer is received, or a CONTROL_OUT transfer is received, then as shown in box 50, a stall handshake is sent in the same manner as if a CONTROL_IN transfer was not included in the status for a command not requiring return data or the status transfer in the command was a CONTROL_OUT.

Once the data has been sent to the host in state 39 of FIG. 3 and in block 54 of FIG. 2, universal device controller interface 14 awaits, in decision block 56, receipt of an acknowledgment of the transfer. If acknowledgment is received, in block 62, the universal device controller interface signals a valid transfer. If the transfer acknowledgment is not received, then as shown in block 60, the device signals an invalid transfer.

Figure 2C:
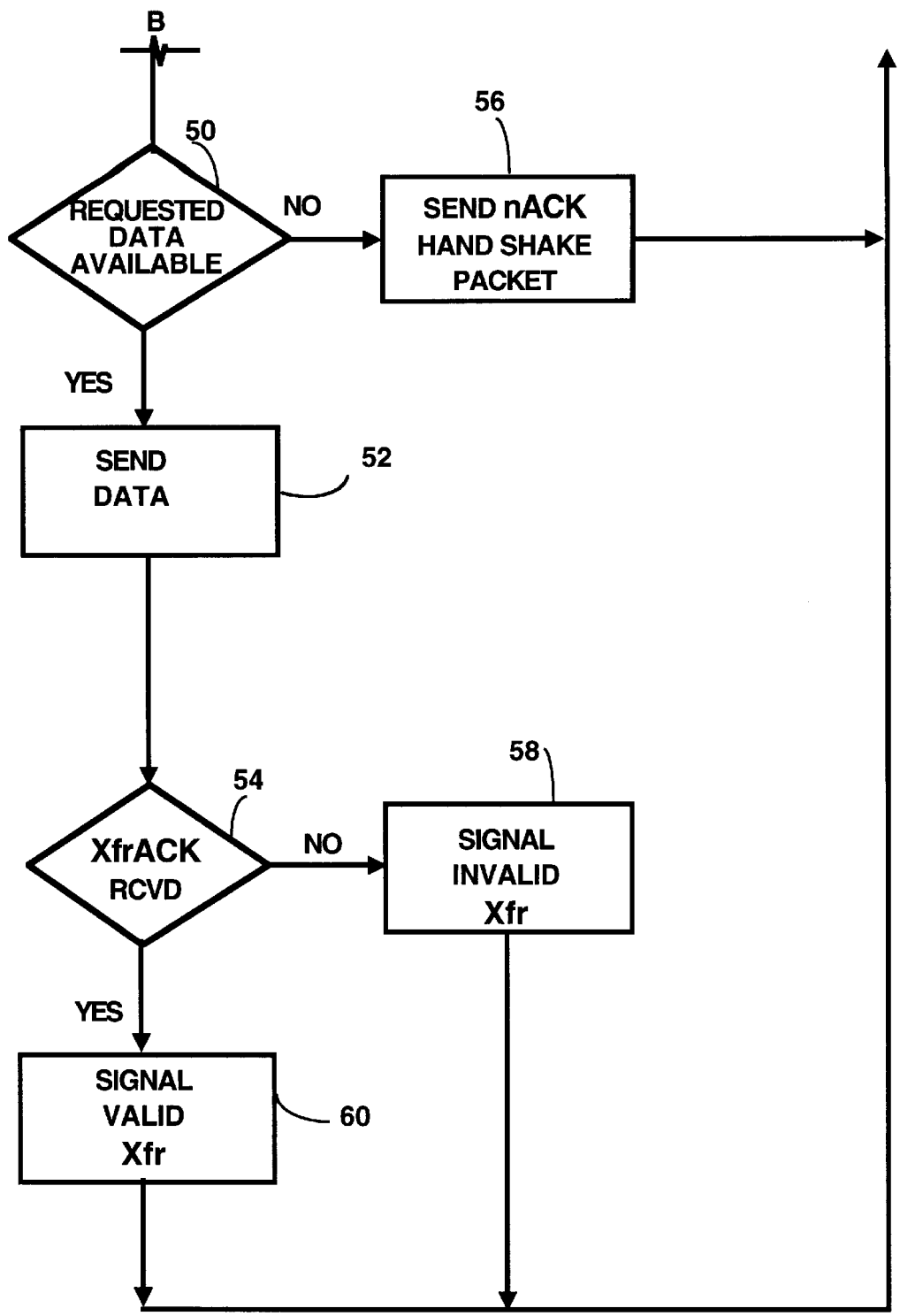

As shown in state circle 43 of FIG. 3, and in FIG. 2C, if the data identified in block 34 is an interrupt request packet in block 38 of FIG. 2A, a decision is made in decision block 50 whether the requested data is available. If the answer is yes, as shown in circle 41 of FIG. 3 and then in block 52 of FIG. 2 the data is sent through the universal serial bus device controller 12 to the host and then awaits, in decision block 54, for an acknowledgment of receipt of the transferred data.

If the data transfer is acknowledged, the universal device controller interface then signals that a valid transfer has occurred and resets in decision block 60. If in decision block 50 it is determined that the requested data is not available, then a not acknowledged handshake packet signal is sent to universal serial bus device controller 12 and ultimately to the host. If the requested data was available and was sent in box 52, and no acknowledgment is received in decision box 54, then as is shown in box 58, the universal device controller interface 14 signals an invalid transfer and the device resets.

Figure 2D:
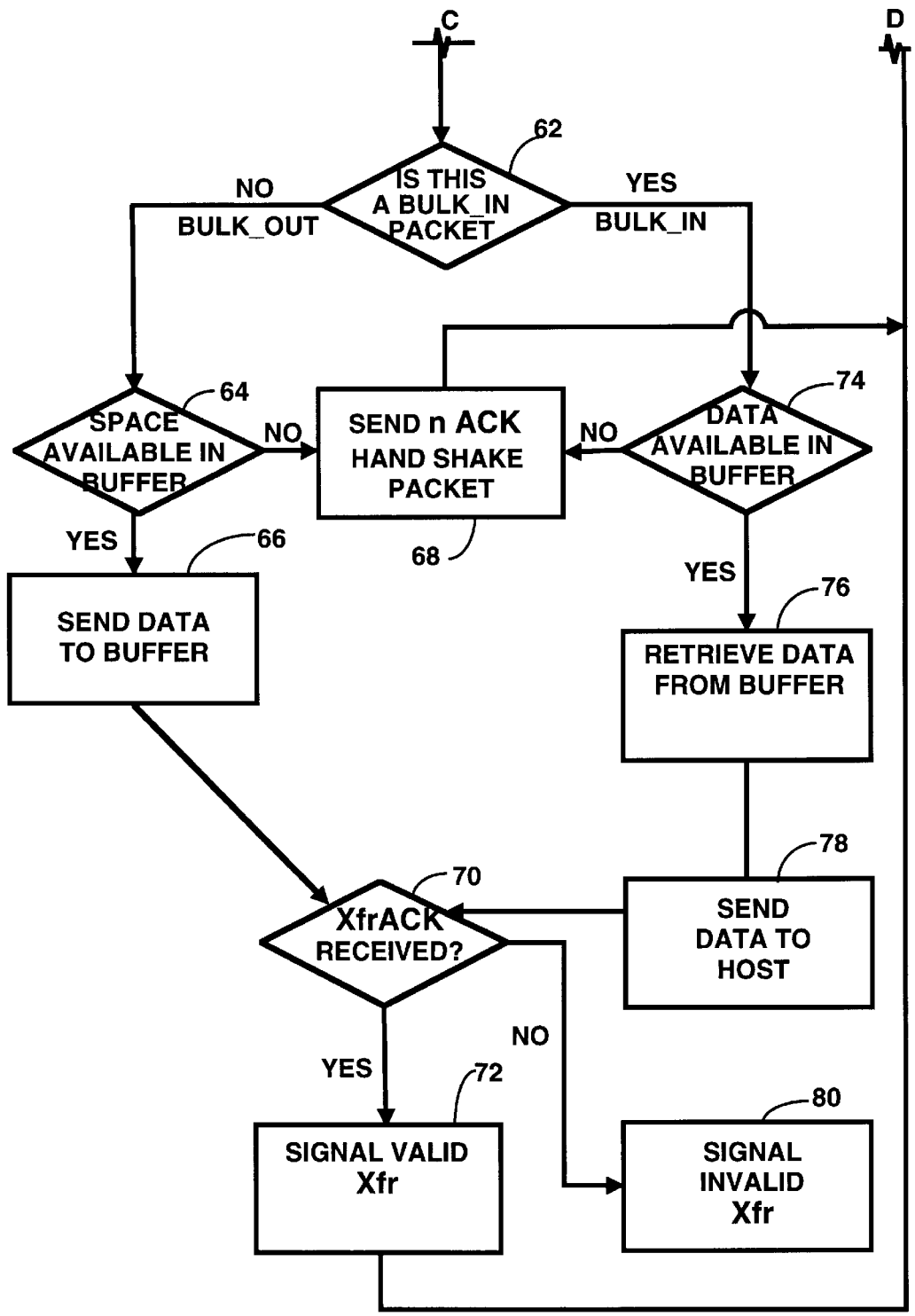

If the data transfer initiation identified in box 34 indicates that it is a data packet, then in decision box 62, as shown in FIG. 2D, a decision is made as to whether it is a BULK_OUT packet of data from the host or a BULK_IN data packet to be sent from the universal device to the host in which case universal device controller interface transitions to the BULK_OUT_ or the BULK_IN state shown in circles 39 and 41 of FIG. 3, as the case may be.

If it is a BULK_OUT packet, and the decision in decision box 62 is no, then in decision box 64 the decision is made as to whether there is sufficient storage space in the buffer to receive the data. Data packets are transferred through the universal serial bus device controller 12 in eight bit bytes, one at a time. As each byte is received, the decision is made concerning space availability in decision box 64. If the decision is yes, then the data is sent to the buffer for storage, as shown in box 66. If the decision is no, a not acknowledged handshake packet is sent as shown in box 68. Once the data is received and sent to the buffer in box 66, a decision is made in decision box 70 as to whether an acknowledgment is received for the data. If the answer is yes, then in box 72 the universal device controller interface 14 signals a valid transfer.

If the decision in decision box 62 is that the data is a BULK_IN packet which is data received from the peripheral for transfer to the host in response to an interrupt request, then in decision box 74, a decision is made as to whether the data is available in the buffer. If it is not, then a not acknowledged (nACK) handshake packet is sent to the universal serial bus device 12. If the answer is yes, then in box 76 the data is retrieved from the buffer, and in box 78 is sent to the host, and in decision box 70 a decision is made as to whether or not an acknowledgment is received for the data sent. If the answer is yes, then in box 72 the interface 14 signals a valid transfer and if the answer is no, then as shown in box 80, the signal is for an invalid transfer.

Figure 4:
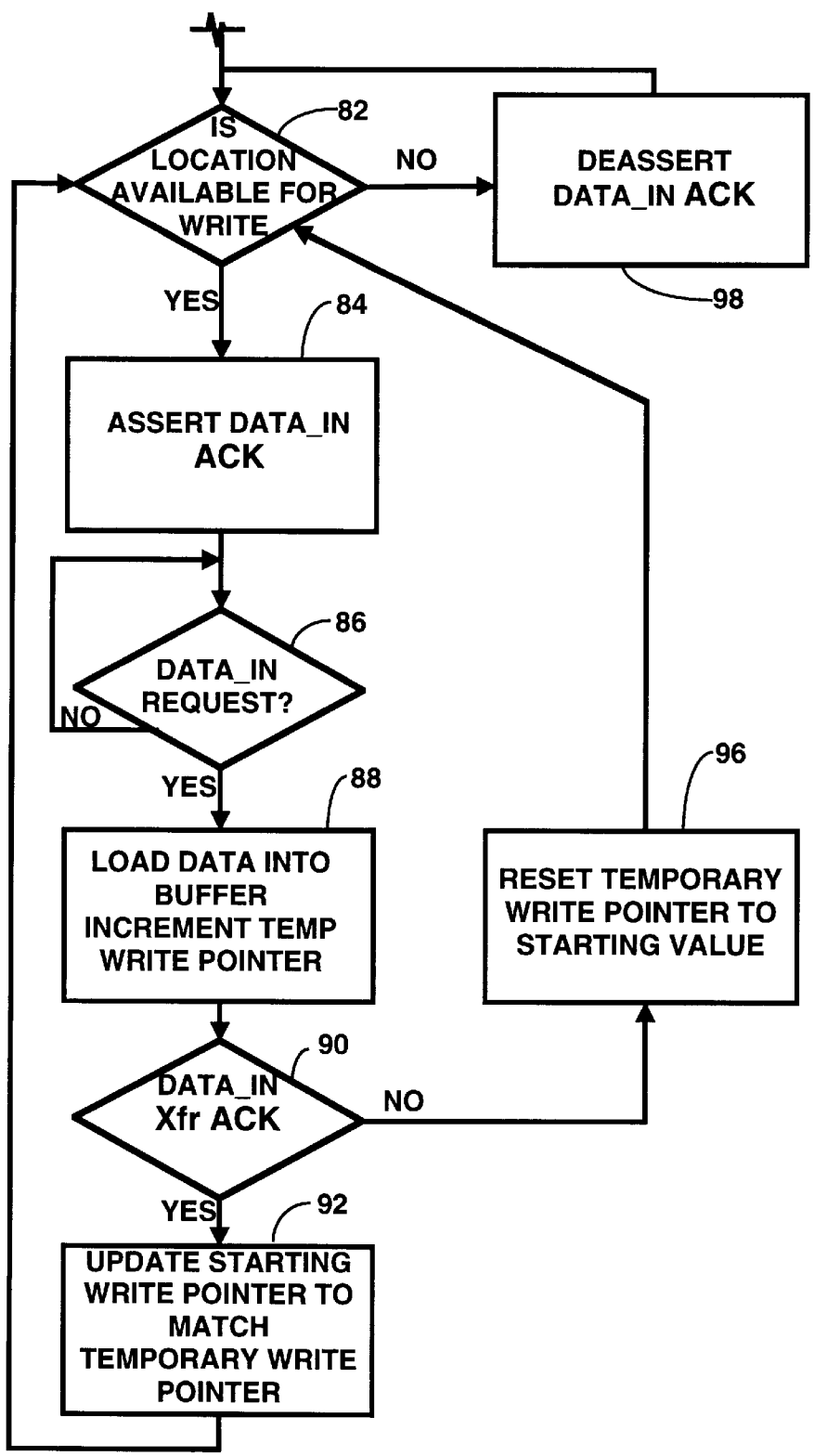
FIG. 4 is a block diagram flow chart of the data write operations of the buffer.

FIG. 4 is a flow chart showing how data is written into buffer memory 16 in response to the operation shown in FIG. 66 of FIG. 2D when data is sent to the buffer.

As data is sent to buffer memory 16 as shown in block 66 of FIG. 2D, the first decision made in buffer memory 16 is as shown in decision box 82 of FIG. 4. The decision made is whether there is a location available for writing the next byte of information. In the buffer, in the preferred embodiment, each byte of information is treated and processed separately. If the answer in decision box 82 is yes, there is a location available to write a byte of information, then in box 84 an ASSERT DATA_IN signal is sent to universal device controller interface 14 acknowledging that there is a space available. Once the signal is sent, then buffer memory 16 waits, at decision box 86, to receive the DATA_IN request. Once the DATA_IN request is received as shown in decision box 86, the operations described in box 88 occur, namely the data is loaded into buffer memory 16, and the temporary write pointer is incremented to the next byte in the buffer memory and buffer memory 16 then waits for an acknowledgment that the transfer is completed in decision box 90, and if it is received, then as shown in box 92, the starting write pointer is updated to match the temporary write pointer.

In the event no transfer acknowledgment is received regarding the DATA_IN signal, then in decision box 94 a not acknowledged (nACK) signal regarding receipt of the DATA_IN signal. After which, in box 96 the temporary write pointer is reset to the original starting value.

In the event no location is available for writing the byte of data, then as shown in box 98, a DE_ASSERT data input acknowledgment signal is sent.

Figure 5:
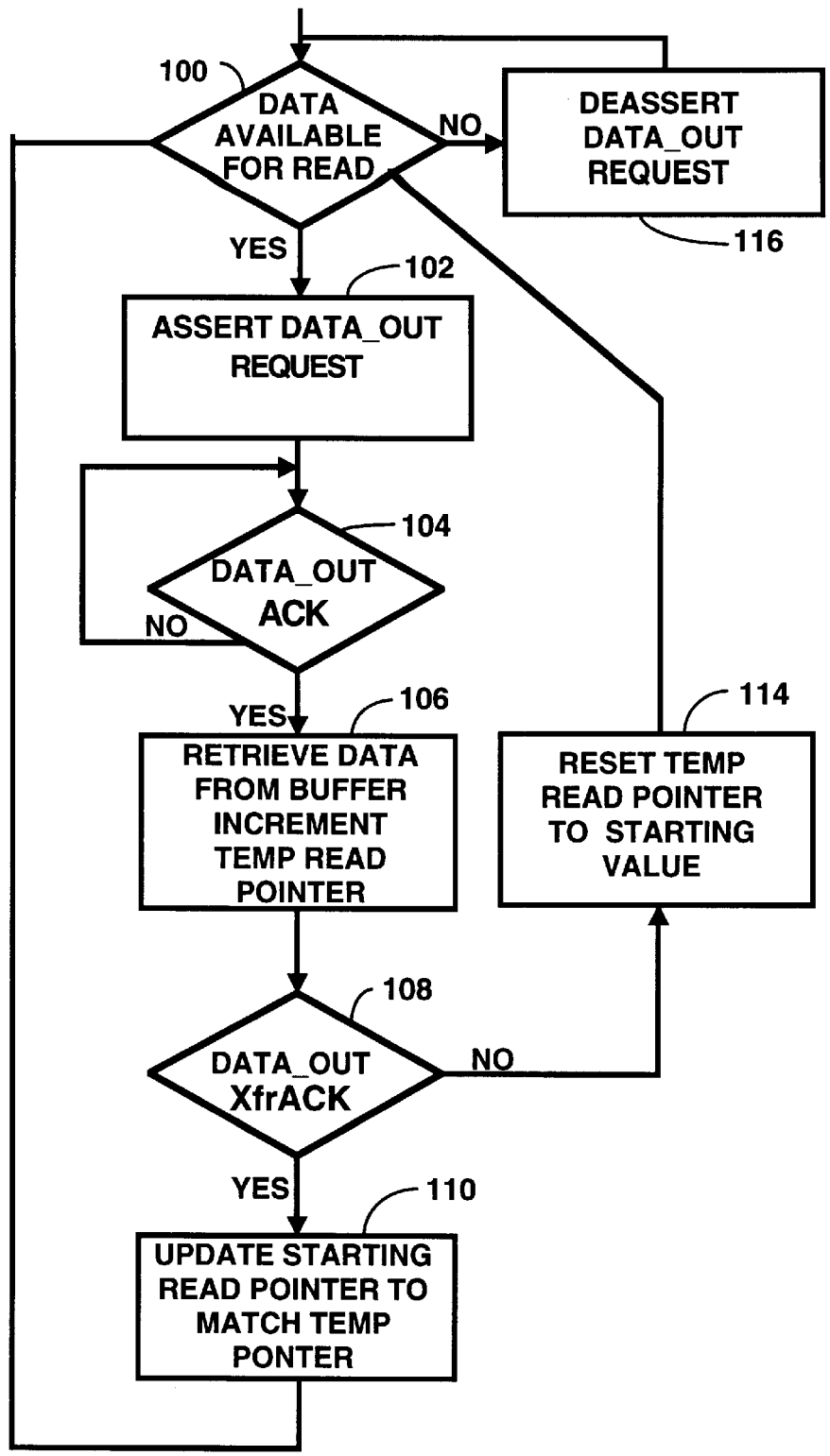
FIG. 5 is a block diagram flow chart of the data read operations of the buffer.

How data is read from buffer memory 16 is shown in the flow chart of FIG. 5. First, in decision box 100, a decision is made as to whether the data byte is available for read. If the answer is yes, then in box 102 an ASSERT DATA_OUT request is made, and in decision box 104 a decision is made as to whether or not the ASSERTED DATA_OUT request is acknowledged. If not, buffer memory 16 waits for its receipt. Once it is received, then in box 106 the data is retrieved from the buffer and the temporary read pointer is incremented to the next byte. Afterwards, in decision box 108, the data out transfer acknowledgment is awaited, and upon receipt, in box 110, the starting read pointer is updated to match the temporary read pointer.

If the data out transfer acknowledgment is not received, then in decision box 112 a data out transfer is not acknowledged, nACK, is sent and in box 114 the temporary read pointer is reset to its starting value.

In the event that data is not available for read as determined in decision box 100, then a DE_ASSERT DATA_OUT request is made in box 116.

Figure 6:
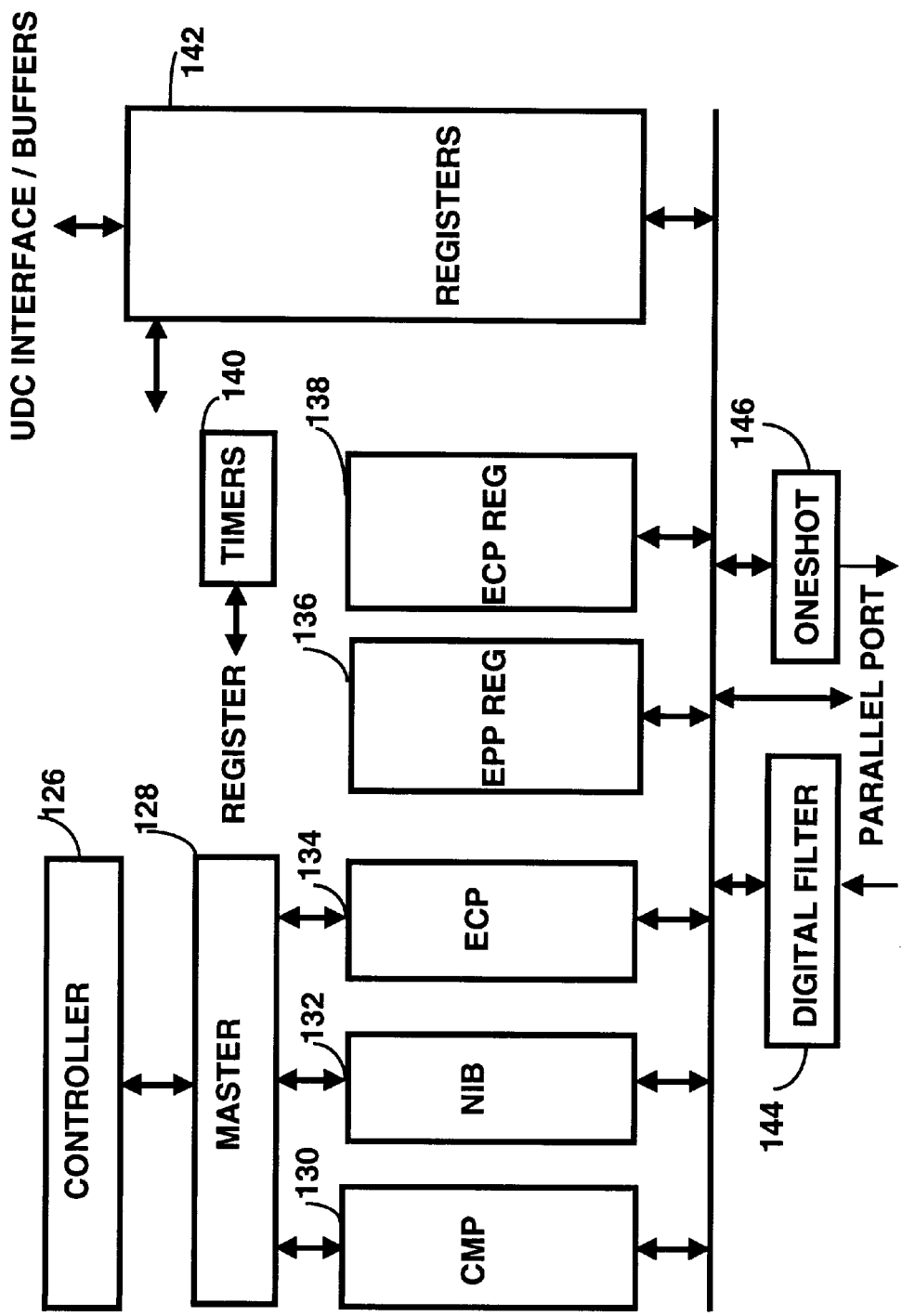
FIG. 6 is a high level block diagram of the parallel port interface module.

In FIG. 6 there is shown and described a high level block diagram for the parallel port interface module 20. At the heart of parallel port interface module 20 is controller 126, which is used to control, through master state machine 128, compatibility mode protocol host 130, NIBBLE protocol host 132 and extended capabilities port host 134. A digital filter 144 is provided for incoming signals. It is optionally used to filter spurious or false signals by holding and not passing on each signal until a predetermined number of clock ticks occur, thus assuring that all signals inputted to parallel port interface module 20 are true signals. Also provided, as shown in the block diagram of FIG. 6 there is an extended parallel port register host 136 and extended capabilities port register host 138. Control registers 142 are provided. One shot 146 generates a fixed pulse signal to transition the parallel port interface module 20 output to high drive by generation of a fixed pulse signal.

Figure 7A:
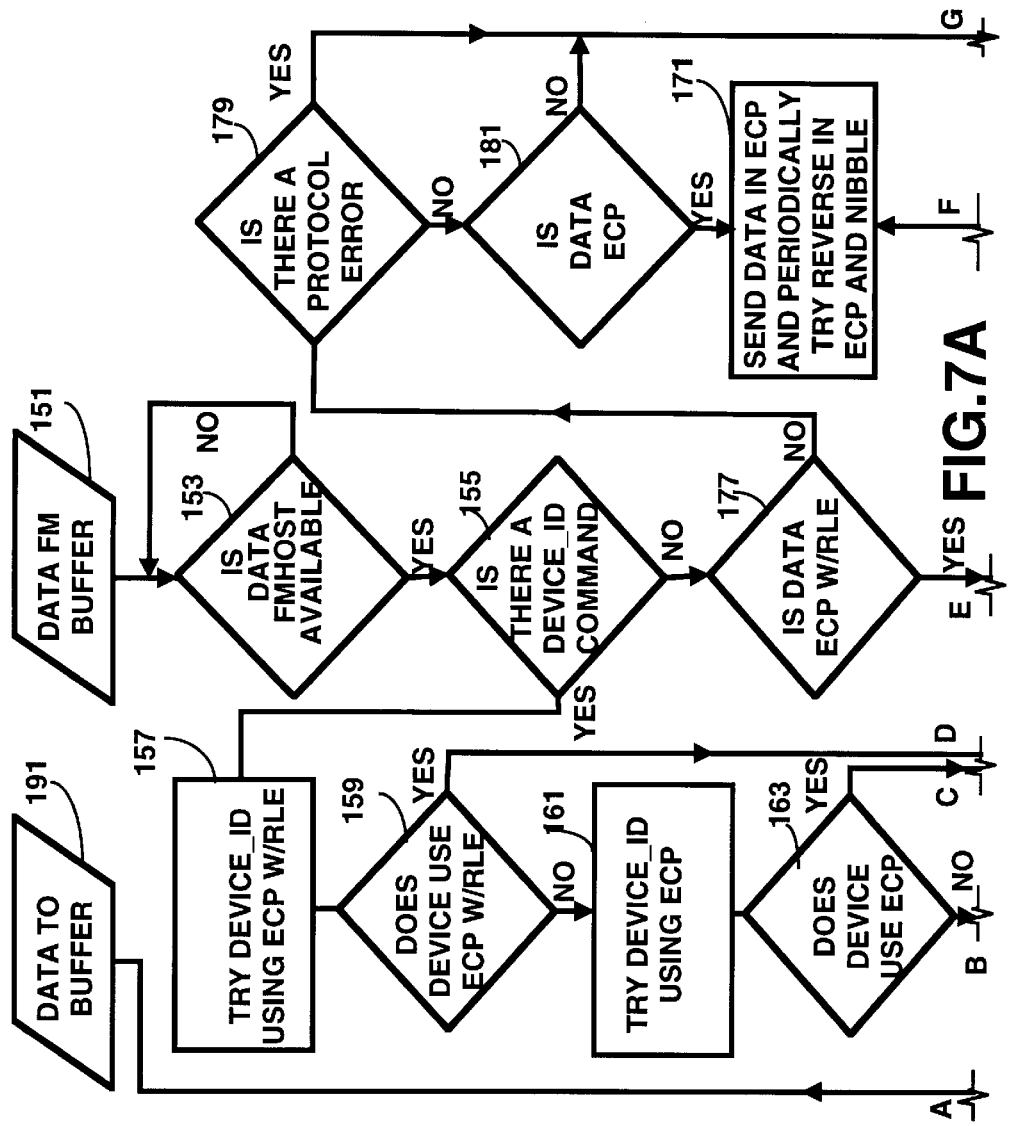
FIG. 7 is a flow chart block diagram of the parallel port interface module.
Figure 7B:
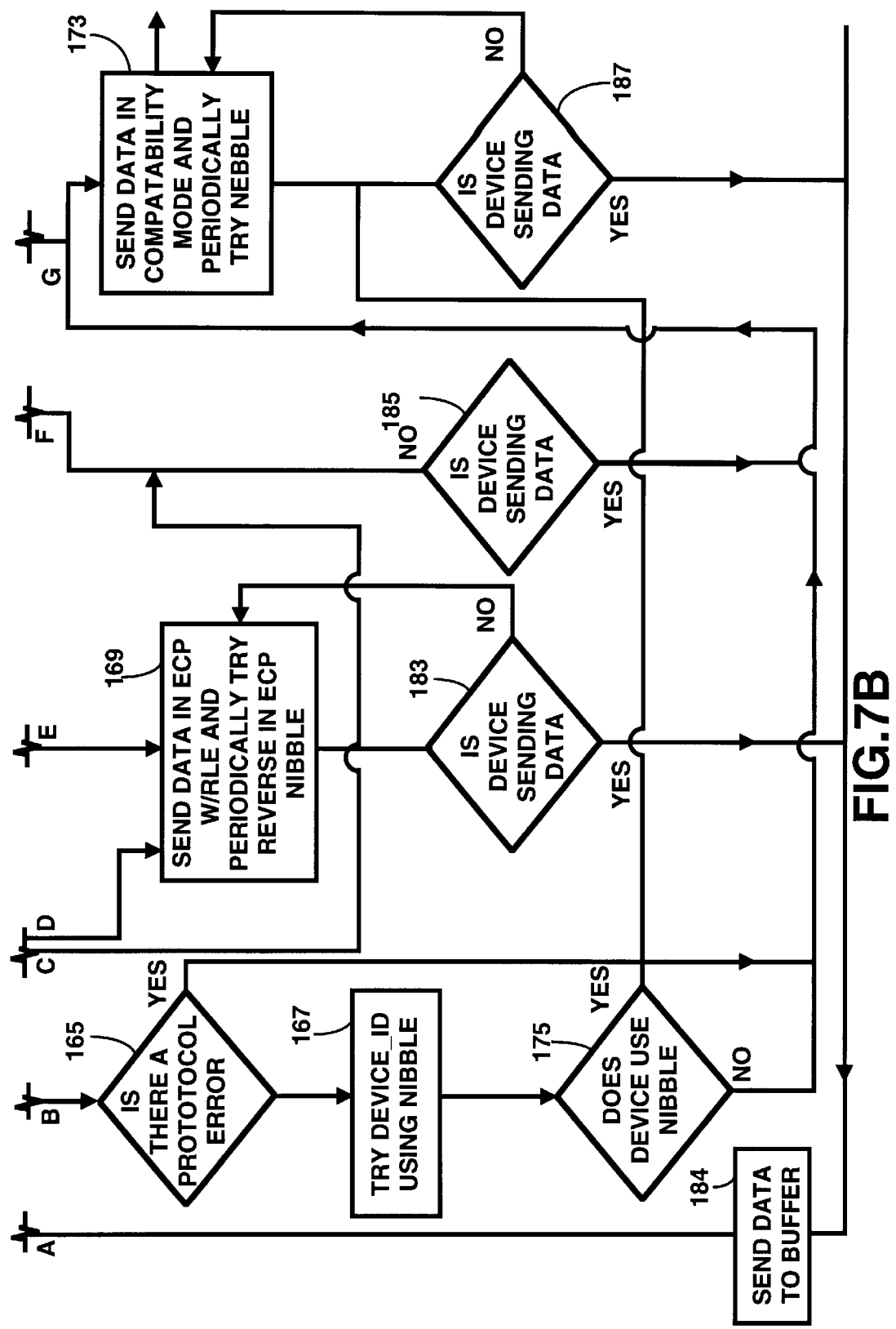

FIGS. 7A and 7B represent a flow chart for the operations of parallel port interface module 20, as shown in FIG. 6. The parallel port interface module 20 attempts to communicate with the peripheral device in the highest, or most advanced, communication protocol that the peripheral device is capable of using. It uses a hierarchie order of the IEEE 1284 communications protocol, starting with the most advanced communications protocol, and stepping down through hierarchie until it establishes communications with the peripheral device.

As seen in FIGS. 7A and 7B, data from the buffer 16 is received through the parallel port interface module 20 through data transfer box 151. As it is received, the first decision is made in decision box 153 is whether data from the host is available. If the answer is no, then parallel port interface module 20 remains in an idle state. If the answer is yes, then a decision is made in decision box 155, is there a DEVICE_ID command in the data that is available. The DEVICE_ID command is the result of the translation of a USB command protocol entitled GET DEVICE_ID which is the USB command protocol command which requests data from the peripheral regarding the identification of the manufacturer of the peripheral device, the type of device it is, and what communications protocols the peripheral supports. The GET DEVICE_ID command is very similar to the DEVICE_IN command of the extended communication port communications protocol utilized by devices which are compliant with IEEE 1284 specifications. As a result, as shown in FIGS. 2A through 2D, the USB GET DEVICE_ID command of the USB protocol is translated into a DEVICE_ID command. If the answer in decision box 155 is yes, then in box 157 an attempt is made to send the DEVICE_ID command to the peripheral using extended capabilities port protocols with run length encoding. A decision has been made in decision box 159 as to whether the peripheral device communicates in extended capabilities port protocol with run length encoding. If the answer is yes, then in box 169 the command, and later data, is sent in extended capabilities port protocol with run length encoding, and periodically a TRY_REVERSE command is sent in extended capabilities port protocol and NIBBLE. If the answer is no, then in box 161 the parallel port interface module 20 will try the DEVICE_ID command using extended capabilities port protocol without run length encoding. If communication is established in extended capabilities protocol as shown in decision box 163, then in box 171 data is then sent to the device in extended capabilities protocol and the parallel port interface module 20 periodically tries reverse communication in extended_capabilities protocol and_NIBBLE.

If the answer in decision box 163 is no in that the device does not use the extended capabilities communications protocol, then in decision box 165 a decision is made as to whether there exists a protocol error. If the answer is yes, then data is sent as shown in box 173 in the compatibility mode and the device periodically tries NIBBLE.

If the answer in decision box 165 was no, there was no protocol error, then in box 167 parallel port interface module 20 tries the DEVICE_ID command using NIBBLE. Irrespective of whether the device does or does not use NIBBLE, parallel port interface module 20 will begin to send data in the compatibility mode as shown in box 173 and will periodically try NIBBLE irrespective of whether or not the DEVICE_ID command indicated that the device used it.

If it is determined in decision box 155 that the incoming data does not contain a DEVICE_ID command, then in box 177 a decision is made as to whether the incoming data is enhanced capabilities protocol encoded with run length encoding. If the answer is yes, then the data will be sent as shown in box 169 in extended capabilities protocol with run length encoding and parallel port interface module 20 will periodically try reverse in capabilities protocol and in NIBBLE. If it is determined in decision box 177 that there is no run length encoding, then in decision box 179 the decision is made as to whether or not a protocol error has occurred. If the answer is yes, then the data is sent as shown in box 173 in the compatibility mode. If the decision in box 179 is no, then a determination is made in decision box 181 as to whether the data is in extended capabilities protocol encoded without run length encoding. If the answer is yes, then data is sent in capabilities protocol and the parallel port interface module 20 will periodically try reverse in extended capabilities protocol and NIBBLE. If the decision in decision box 181 is no, then the data is sent in the compatibility mode and the parallel port interface module will periodically try to communicate with the device in NIBBLE.

In each case, whether the data is being sent in extended capabilities protocol with run length encoding, or without it, or if it is being sent in compatibility mode, the parallel port interface module 20 will periodically attempt to run reversed so as to receive data from the device. This is shown in decision boxes 183, 185 and 187. If the decision is yes, then in box 189 the data is sent to the buffer through transfer box 191.

Figure 8:
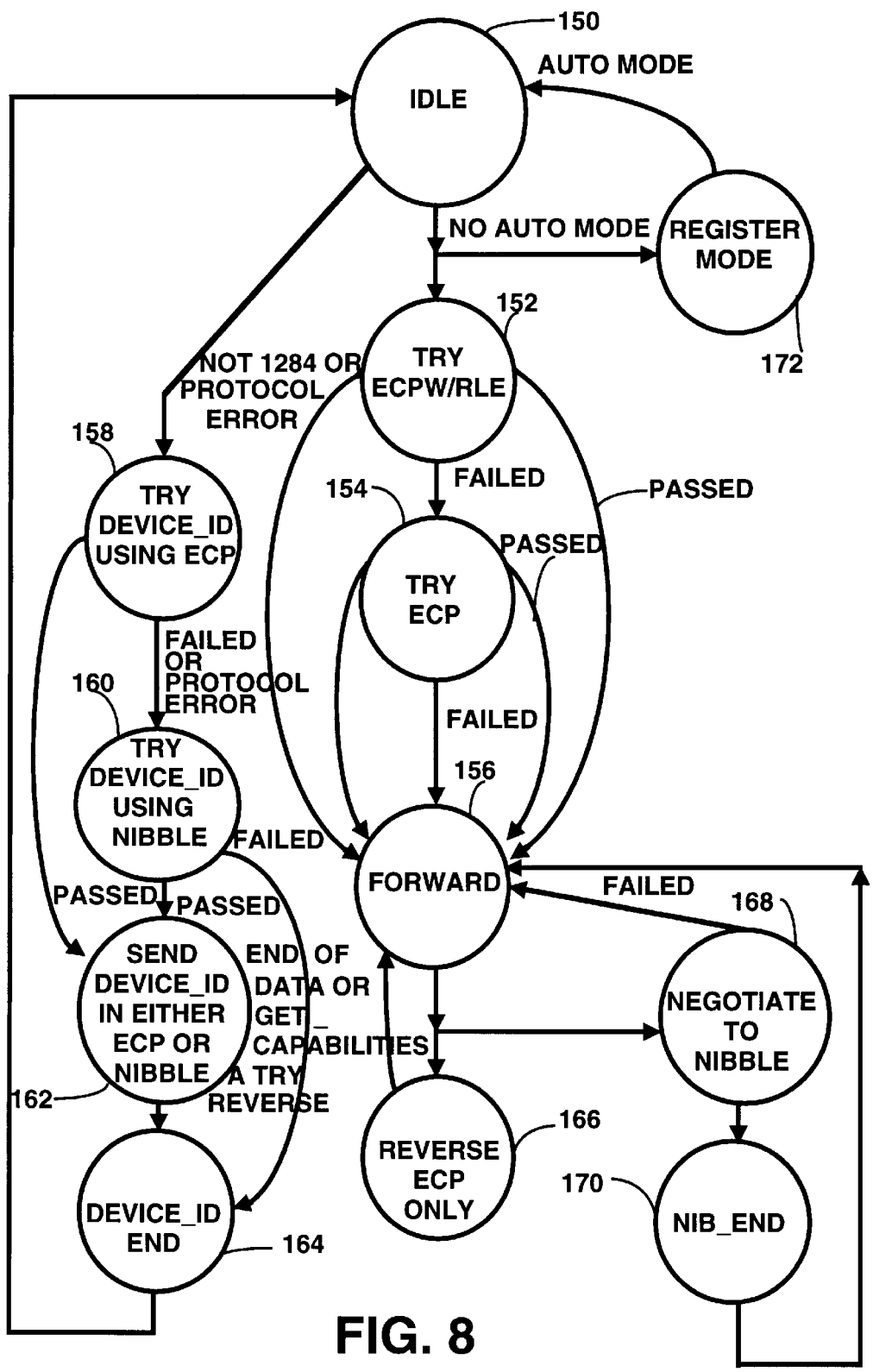
FIG. 8 is a state transition diagram for the controller operations of the parallel port interface module.

Next, there is shown in FIG. 8 a state transition diagram of the operations of controller 126 of FIG. 6 for the parallel port interface module 20. As previously stated, signal converter 10 can support three of the basic communications protocols used with a parallel port I/O device conforming to the IEEE 1284 standard. These are: the compatibility mode protocol; the extended capabilities port (ECP) with or without run length encoded (RLE) compression protocol; and the enhanced parallel port protocol (EPP). As shown in circle 150 of FIG. 8, the power up state is idle and the parallel port interface module 20 is in compatibility mode. This is the default in which the parallel port interface module 20 will initially start.

After starting in compatibility mode protocol, controller 126 will attempt to change states to the highest level protocol available, which, in the preferred embodiment, in automatic operation is extended capabilities port (ECP) protocol with run length encoding. If the peripheral device will communicate using this protocol, controller 126 passes to the forward state shown in circle 156 wherein the parallel port interface module 20 will communicate and pass data to the peripheral device using extended capabilities port protocol with run length encoding. In the event that the peripheral device cannot communicate in this protocol, then the parallel port interface module 20, controller 126 will attempt to communicate with the peripheral device utilizing the next highest protocol available, which is extended capabilities port protocol as shown in state 154. If the peripheral device can communicate in this state, the machine passes into the forward state shown in circle 156 wherein it again begins sending data to the peripheral device using extended communications port protocol without run length encoding. If the attempt to communicate using extended communications port protocol fails because the peripheral device is not configured to communicate in that protocol, controller 126 shifts into the forward state of 156 utilizing the default protocol, namely the compatibility mode protocol.

If in the attempts to use the higher level protocol languages, controller 126 for the parallel port interface module detects either that the peripheral device is not IEEE 1284 compliant, or that there is a protocol error, it will automatically shift into the forward transmission state shown in circle 156 utilizing the lowest level protocol language, namely the compatibility mode.

One of the initial command packets that will be sent by the host device utilizing USB command protocols is the command GET_DEVICE_ID which is a command which requests data from the peripheral regarding the name of the manufacturer of the peripheral device, the type of device it is, and what communication protocols the peripheral supports. This command is very similar to the DEVICE_ID command utilized by devices which are compliant with IEEE 1284 specifications. As a result, the GET_DEVICE_ID command of the USB protocol is translated into a DEVICE_ID command. If the GET_DEVICE_ID command is received, then in parallel port interface module 20, controller 126 will attempt to try the DEVICE_ID and command using extended capability port communications protocol as shown in state circle 158. If it fails in state 158, or if there is a protocol error, it will attempt again to try the DEVICE_ID command in the NIBBLE communication protocol as shown in state 160. If this fails, the controller shifts into forward state 156.

If either the first attempt to communicate the DEVICE_ID command using ECP,(extended capabilities port) or the attempt to communicate it using the NIBBLE protocol succeeds, then controller 126 passes into the state shown in circle 162, namely, the receipt of the DEVICE_ID string from the peripheral device in either Extended Communication Port (ECP) or NIBBLE protocols, whichever first worked. And finally, after receiving the strings, controller 126 enters a state shown in circle 164, namely the signaling of the end of the DEVICE_ID transfer, and a return to the default state of 150, namely the idle state.

During forward state operations as shown in circle 156, when operating in ECP, the controller will periodically issue a TRY_REVERSE command to shift operations into reverse extended capabilities communications protocol, as shown in state 156. This attempt to try reverse operations occurs at a possible end of the data, or after a certain period of time of being in the forward state, in which case the controller operates the parallel port interface module 20 in reverse to pass data from the peripheral back to the host. If forward state operations 156 are being conducted in compatibility mode protocol, any attempt to communicate with the peripheral will be done through negotiation to NIBBLE, as shown in circle 168. If the attempt to negotiate to NIBBLE as shown in 168 fails, then controller 126 reverts to the forward operation of state 156. In the event that the negotiation to NIBBLE of state 168 is successful, there will be NIBBLE communication from the peripheral to the host until the end of the data at which time the NIB_END state shown in circle 170 is extended, and operations of the controller revert to the forward state 156.

Figure 9:
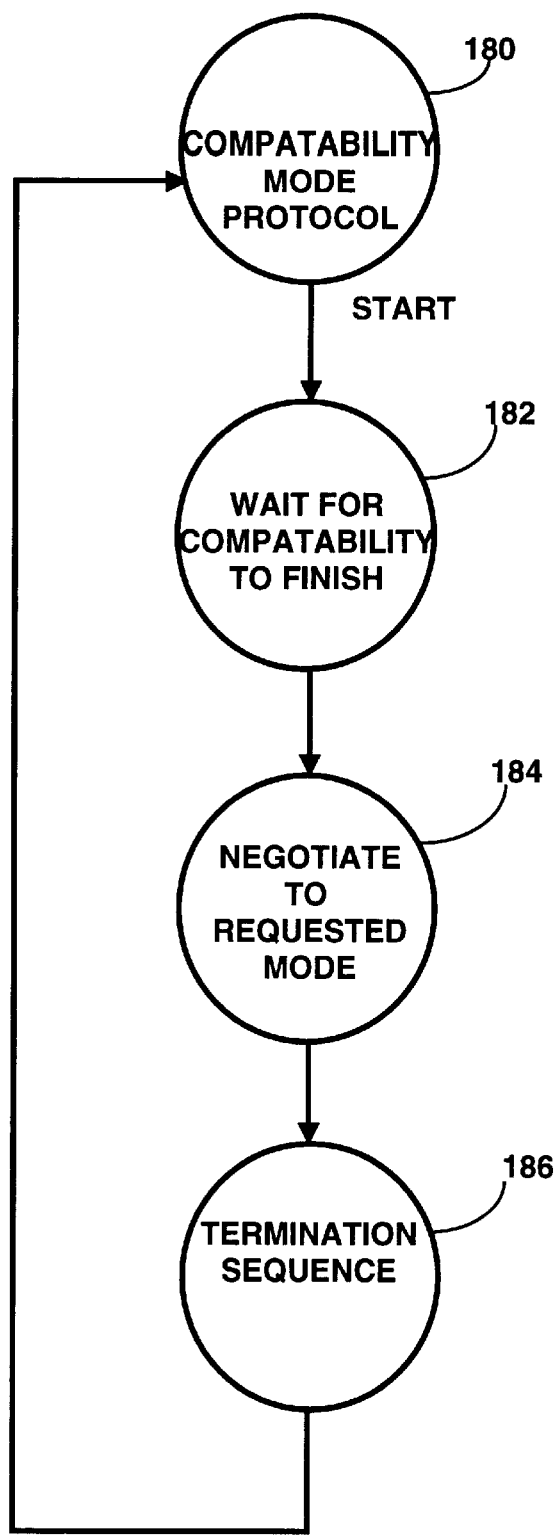
FIG. 9 is a state transition diagram for the master state machine operations of the parallel port interface module.

The master state machine 128 shown in FIG. 6, is also shown in FIG. 9. It is the state machine that accomplishes the attempt to shift modes first into extended capabilities port protocol with run length encoded data, as shown in state 152 of FIG. 8, and if that fails, then tries to shift into enhanced capability port protocol without run length encoded data, as shown in state 154 of FIG. 8, and finally into compatibility mode protocol for forward operations as shown in state 156 of FIG. 8. It also accomplishes the transitions to negotiations to the NIBBLE protocol and the DEVICE_ID protocol, also as shown in FIG. 8.

As shown in FIG. 9, the starting, or default state 180 is for operation in the compatibility mode protocol. Upon receipt of a start signal, the master state machine waits for if compatibility mode protocol operations to finish in state 182, and in state 184 will negotiate to the requested mode and upon completion of that mode shifts to termination sequence shown in state 186.

Figure 10:
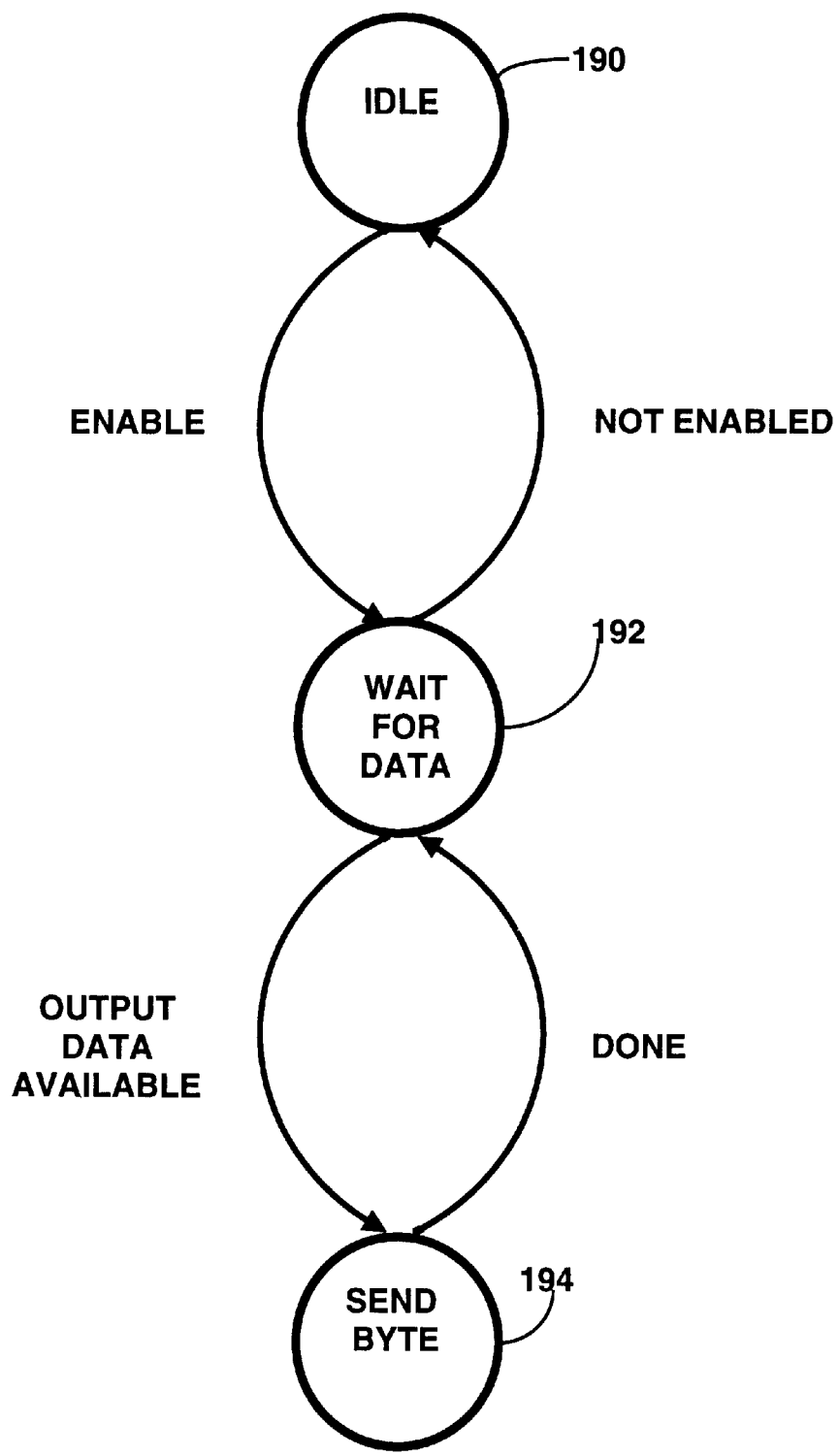
FIG. 10 is a state transition diagram of the operations of the compatibility mode host for the parallel port interface module.

FIG. 10 is the state transition diagram for compatibility mode protocol controller 130. Its default state 190 is idled. When enabled, it passes into a wait-for-data state 192, and when output data is available, it passes into send byte state 194.

Figure 11:
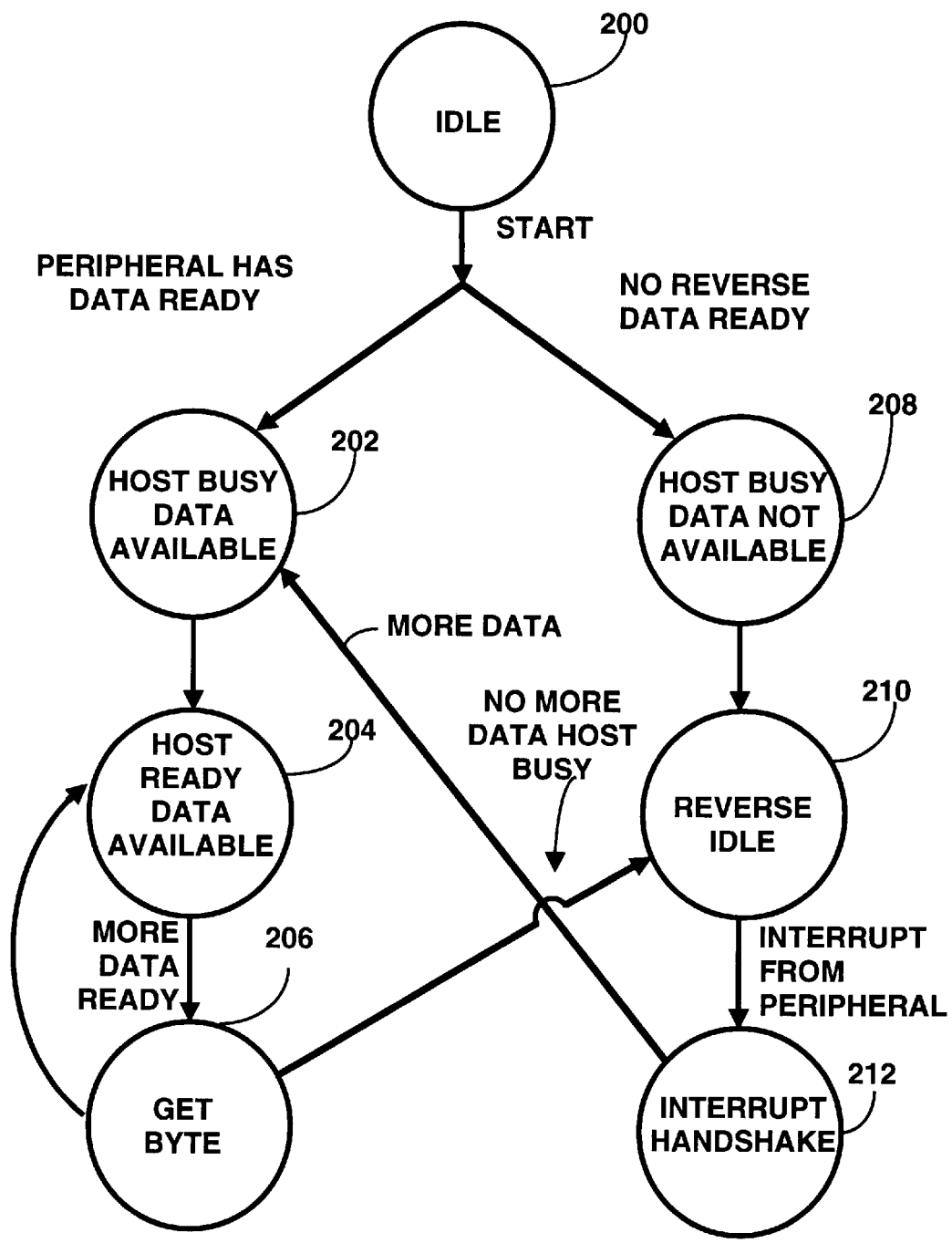
FIG. 11 is a state transition diagram of the NIBBLE mode host of the parallel port interface module.

FIG. 11 is a state transition diagram for NIBBLE controller 132. As shown in FIG. 9, the default state 200 is idle. When controller 126 initiates NIBBLE controller 132, and the peripheral has data ready, NIBBLE controller 132 transitions to state 202, which is defined under IEEE 1284 standards as host busy data available. When the host is ready, the NIBBLE controller transitions to state 204, host ready data available, and then state 206, wherein a byte of data is retrieved. If there is more data to be sent from the peripheral, then the NIBBLE controller transitions back to state 204.

State 208 exists when the host is busy and data is not available, in which case the NIBBLE controller transitions to reverse idle state 210 until it receives an interrupt from the peripheral indicating data is available, as shown in state 212, in which case the NIBBLE controller 132 transitions back to state 202, host busy, data available.

Figure 12:
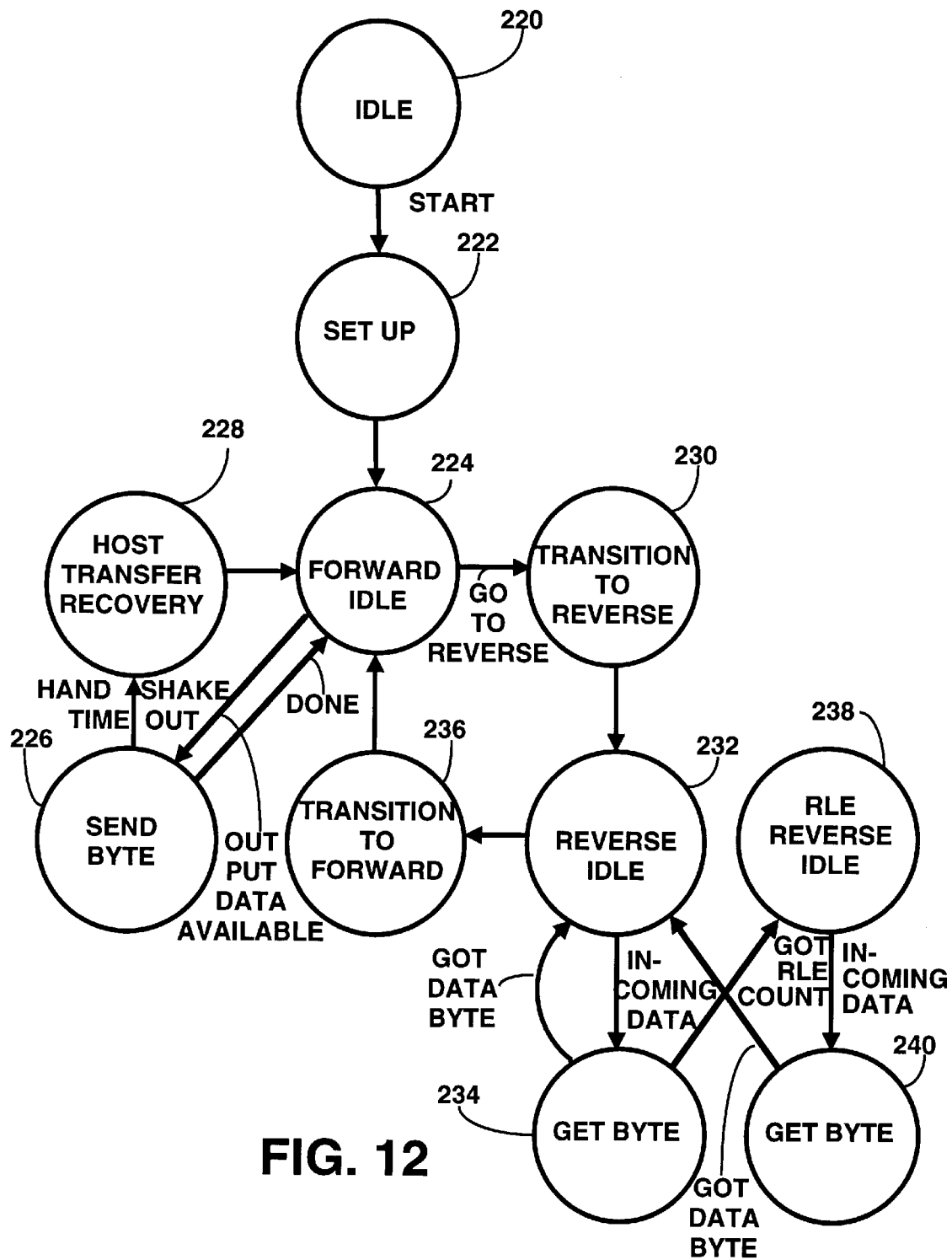
FIG. 12 is a master state transition diagram of the ECP host operations of the parallel port interface module.

FIG. 12 is a state transition diagram for ECP controller 134. As with NIBBLE controller 132, the default state 220 for ECP controller is idled. Upon the start command, it passes into the setup state 222 and then into the forward idle state 224. States 224 and 226 are the primary data out states for Extended Communications Protocol controller 134, wherein Extended Communications Protocol controller 134 shifts between forward idle and sending bytes. If, during the course of sending data and shifting between states 224 and 226, controller 126 signals a TRY_REVERSE command. Extended Communications Protocol controller 134 will transition through the forward idle state 224 to the transition to reverse state 230.

From the transition to reverse state 230, the controller transitions to reverse idle state 232, and then alternately transfers back and forth between reverse idle 232 and the GET_BYTE 234 state, as data is transferred in reverse from the peripheral to the host.

If the reverse data is run length encoded, then Extended Communications Protocol controller 134 transitions from the GET_BYTE 234 state to run length encoded reverse idle state 238, from where it transitions to GET_BYTE state 240, and then back to reverse idle state 234 as the counted bytes are retrieved and sent.

While the preceding describes the automatic mode of operation under which parallel port interface module 20 is under automatic control of controller 136, as shown in FIG. 8, parallel port interface module 20 is capable of being transitioned into a non-automatic, register mode of operation, as shown in state 172 of state transition diagram FIG. 8. In this mode of operation, the parallel port interface module is operating under direct host control. In practice, it has been found to be a much slower mode of operation, but is necessary for use with peripheral devices which use additional commands and communications protocols which are not standard to the specifications for these protocols.

Figure 13:
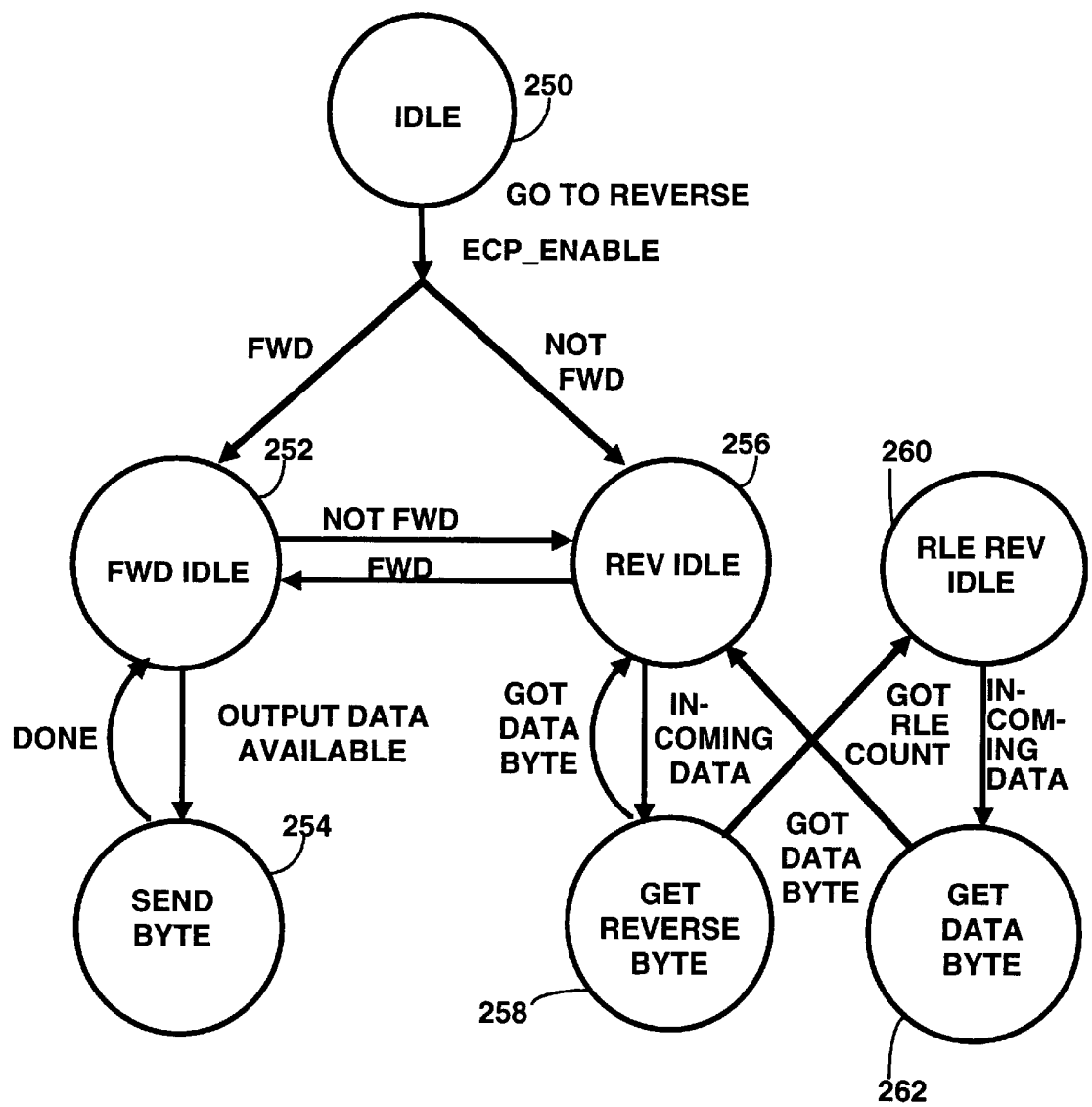
FIG. 13 is a diagram of the ECP host in register mode operations of the parallel port interface module.

In register operation utilizing extended capabilities port language, ECP register mode controller 138 is utilized. A state transition diagram describing the operations of Extended Communications Protocol register mode controller 138 is shown and disclosed in FIG. 13. Its default state is idle. Upon transition of controller 126 to its register mode state 172 as shown in FIG. 8, and the receipt of a signal from the host to enable Extended Communications Protocol register mode controller 138, Extended Communications Protocol register mode operation controller 138 shifts from the idle state 250 into either the forward idle state 252 or reverse idle state 256, depending upon whether or not the command from the host is transitioned to either forward or not forward.

If the transition is to the forward idle state 252, then the Extended Communications Protocol register mode controller 138 shifts between the forward idle state 252 of the send byte state 254 as long as output data is available, or until a command is received from the host to transition from the forward idle state 252 to the reverse idle state 256.

Upon transitioning to the reverse idle state 256, the Extended Communications Protocol register mode controller 138 will transition to GET_REVERSE byte state 258, and will alternately continue transitioning between reverse idle 256 and GET_REVERSE byte state 258 until the data is transferred.

If, however, the reverse data is run length encoded, then upon transitioning to the GET_REVERSE byte state 258, it will transition from there to run length encoded reverse idle state 260, and from there to get data bytes state 262, and then back to reverse idle state 256.

Figure 14:
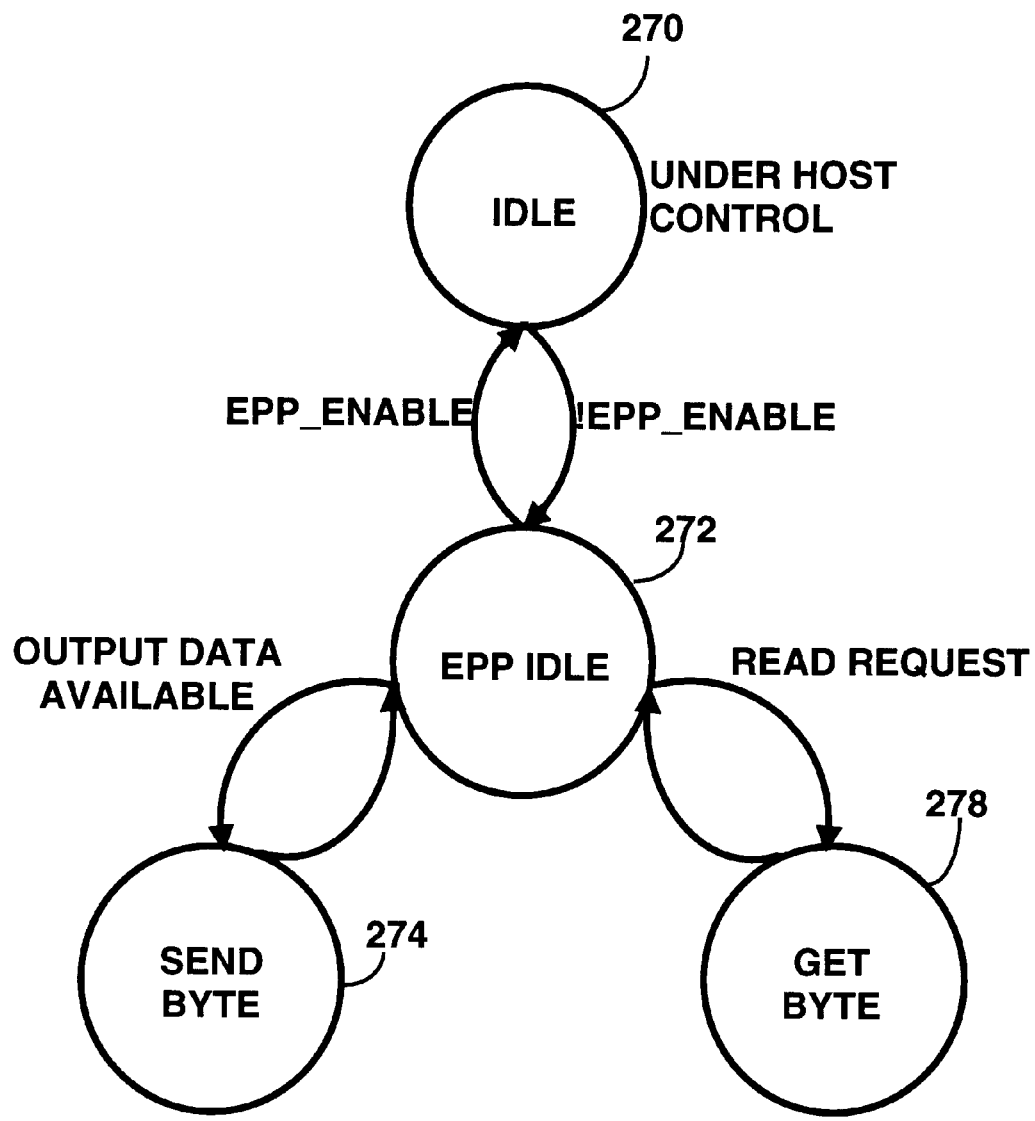
FIG. 14 is a state transition diagram of the EPP host operations in register mode operations for the parallel port interface module.

In register mode operations, parallel port interface module 20 is also capable of communicating with the peripheral using enhanced parallel port (EPP) protocols through enhanced parallel port register mode controller 136. FIG. 14 discloses a state transition diagram 4 and enhanced parallel port register mode controller 136. Again, in this mode of operation, the parallel port interface module is under direct host control through controller 136, and begins in its initial idle state 270. Upon receipt of an enhanced parallel port protocol signal from the host, the enhanced parallel port register mode controller transitions to an idle state 272, from where it can transition to either send byte state 274 or GET byte state 276.

While there is shown and described the present preferred embodiment of the invention, it is to be distinctly understood that this invention is not limited thereto but may be variously embodied to practice within the scope of the following claims.

I claim:

1. A signal converter, for converting a serial bit stream of data, including command data, interrupt request data and data packets, encoded in a Uniform Serial Bus communications protocol, from a host, into data encoded in a communications protocol compliant with IEEE 1284 specifications for retransmission to a parallel port, which comprises:

means for receiving a serial bit stream of data from a host in a Uniform Serial Bus communications protocol;

means for extracting data bytes from the serial bit stream of data from the Uniform Serial Bus communications protocol; and means for transmitting the data bytes in a communications protocol which complies with an IEEE 1284 specifications communications protocol to a parallel port.

2. The signal converter of claim 1 which further comprises:

a memory storing IEEE 1284 specifications information and Uniform Serial Bus specifications information for communications protocols; and a circuit for converting data bytes received in a Uniform Serial Bus communications protocols into comparable data bytes of a communications protocol which complies with the specifications for the IEEE 1284 communications protocol stored in said memory.

3. The signal converter of claim 1 which further comprises:

a memory storing IEEE 1284 specifications information for a plurality of communications protocols in an hierarchical order and Uniform Serial Bus specifications information for communications protocols; and a circuit for converting data bytes received in an Uniform Serial Bus communications protocol into comparable data bytes in all of the IEEE 1284 communications protocols stored in said memory.

4. The signal converter of claim 3 which further comprises:

a logic circuit for determining in which hierarchical order converted data bytes of the plurality of IEEE 1284 communications protocols are transmitted to said parallel port.

5. The signal converter of claim 1 wherein said means for extracting data bytes from the serial bit stream of data from the Uniform Serial Bus communications protocol further comprises:

a serial register for converting the serial bit stream of data from the host in a Uniform Serial Bus communications protocol to data bytes;

a circuit for identifying whether said data bytes are command data bytes, interrupt request data bytes or data packet bytes;

a circuit for converting command data bytes from the Uniform Serial Bus communications protocol into comparable command data bytes in an IEEE 1284 specifications communications protocol;

a circuit for converting interrupt request data bytes from the Uniform Serial Bus communications protocol into interrupt request data bytes in an IEEE 1284 specifications communications protocol; and a circuit for converting data packet bytes from the Uniform Serial Bus communications protocol into data packet bytes in an IEEE 1284 specifications communications protocol.

6. A signal converter, for transmitting and receiving a serial bit stream of data, encoded in a Uniform Serial Bus communications protocol to and from a host, and for transmitting and receiving data bytes encoded in a communications protocol compliant with IEEE 1284 specifications to and from a peripheral device, which comprises:

means for transmitting to, and receiving from, said host a serial bit stream of data in a Uniform Serial Bus communications protocol;

means for transmitting to, and receiving from, said peripheral device a stream of data bytes in a communications protocol compliant with IEEE 1284 specifications;

means for extracting data bytes from the serial bit stream of data received from said host in the Uniform Serial Bus communications protocol;

means for converting said extracted data bytes of data into data bytes in a communications protocol compliant with IEEE 1284 specifications; and means for converting said data bytes in a communications protocol compliant with IEEE 1284 specifications received from the peripheral device into a serial bit stream of data in a Uniform Serial Bus communications protocol.

7. The signal converter of claim 6 which further comprises:

a memory storing specifications and information for a communications protocol compliant with an IEEE 1284 specifications and a communications protocol compliant with Uniform Serial Bus specifications; and a logic circuit for using said stored specifications and information for converting data received in both IEEE 1284 and Uniform Serial Bus communications protocols into comparable data bytes of the other communications protocol.

8. The signal converter of claim 6 which further comprises:
   a memory storing specifications and information for a plurality communications protocols compliant with an IEEE 1284 specifications in a hierarchical order and at least one communications protocol compliant with Uniform Serial Bus specifications; and
   a logic circuit for using said stored specifications and information for converting data received in both IEEE 1284 and Uniform Serial Bus communications protocols into comparable data bytes of all of the other communications protocols.

9. The signal converter of claim 8 which further comprises:
   a logic circuit for determining in which hierarchical order converted data bytes of the plurality of IEEE 1284 communications protocols are transmitted to said peripheral device.

10. The signal converter of claim 8 which further comprises:
    a logic circuit for ascertaining which communications protocols compliant with IEEE 1284 specifications said peripheral device is capable of using; and
    a logic circuit for determining in which hierarchical order converted data bytes of the plurality of IEEE 1284 communications protocols are to be used when transmitting data to, and receiving data from, said peripheral device; and
    a circuit for selecting for use the highest communications protocol compliant with IEEE 1284 specifications from said hierarchical order that said peripheral device is capable of using.

11. A signal converter, for interconnection between a host device which sends and receives data encoded in a Uniform Serial Bus communications protocol, and a peripheral device which sends and receives data encoded in a communications protocol compliant with IEEE 1284 specifications, which comprises:
    means for sending and receiving a serial bit stream of data to and from the host in a Uniform Serial Bus communications protocol;
    means for converting data received from the host in a Uniform Serial Bus communications protocol into data encoded in a communications protocol compliant with IEEE 1284 specifications for retransmission to a peripheral device;
    means for converting data received data from a peripheral device encoded in a communications protocol compliant with IEEE 1284 specifications into data encoded in a Uniform Serial Bus communications protocol for retransmission to the host; and
    means for sending and receiving bytes of data to and from the peripheral device.

12. The signal converter of claim 11 which further comprises:
    a memory storing specifications and information for a communications protocol compliant with an IEEE 1284 specifications and a communications protocol compliant with Uniform Serial Bus specifications; and
    a logic circuit for using said stored specifications and information for converting data received in both IEEE 1284 and Uniform Serial Bus communications protocols into comparable data bytes of the other communications protocol.

13. The signal converter of claim 11 which further comprises:
    a memory storing specifications and information for a plurality communications protocols compliant with an IEEE 1284 specifications in a hierarchical order and at least one communications protocol compliant with Uniform Serial Bus specifications; and
    a logic circuit for using said stored specifications and information for converting data received in both IEEE 1284 and Uniform Serial Bus communications protocols into comparable data bytes of all of the other communications protocols.

14. The signal converter of claim 13 which further comprises:
    a logic circuit for determining in which hierarchical order converted data bytes of the plurality of IEEE 1284 communications protocols are transmitted to said peripheral device.

15. The signal converter of claim 13 which further comprises:
    a logic circuit for ascertaining which communications protocols compliant with IEEE 1284 specifications said peripheral device is capable of using; and
    a logic circuit for determining in which hierarchical order converted data bytes of the plurality of IEEE 1284 communications protocols are to be used when transmitting data to, and receiving data from, said peripheral device; and
    a circuit for selecting for use the highest communications protocol compliant with IEEE 1284 specifications from said hierarchical order that said peripheral device is capable of using.

16. Using a signal converter, a method of interconnecting a host device which sends data encoded in a Uniform Serial Bus communications protocol, and a peripheral device which receives data encoded in a communications protocol compliant with IEEE 1284 specifications, which comprises:
    operatively connecting the signal converter to both the host device and the peripheral device;
    receiving a serial bit stream of data from the host device in a Uniform Serial Bus communications protocol;
    converting the data in the signal converter received from the host device in a Uniform Serial Bus communications protocol into data encoded in a communications protocol compliant with IEEE 1284 specifications for retransmission to the peripheral device; and
    retransmitting the converted data to the peripheral device.

17. Using a signal converter, a method of interconnecting a host device which sends and receives data encoded in a Uniform Serial Bus communications protocol, and a peripheral device which sends and receives data encoded in a communications protocol compliant with IEEE 1284 specifications, which comprises:
    operatively connecting the signal converter to both the host device and the peripheral device;
    receiving a serial bit stream of data from the host device in a Uniform Serial Bus communications protocol;
    converting the data, in the signal converter, received from the host device in a Uniform Serial Bus communications protocol into data encoded in a communications protocol compliant with IEEE 1284 specifications for retransmission to the peripheral device;
    retransmitting the converted data to the peripheral device;
    receiving data from the peripheral device encoded in a communications protocol compliant with IEEE 1284 specifications;

converting the data, in the signal converter, received from the peripheral device encoded in a communications protocol compliant with IEEE 1284 specifications, into data encoded in the Uniform Serial Bus communications protocol for retransmission to the host device; and retransmitting the data converted to be data encoded in the Uniform Serial Bus communications protocol to the host device.

18. The method of claim 17 which further comprises:

storing specifications and information for a communications protocol compliant with an IEEE 1284 specifications and a communications protocol compliant with Uniform Serial Bus specifications; and using said stored specifications and information for converting data received in both IEEE 1284 and Uniform Serial Bus communications protocols into comparable data bytes of the other communications protocol.

19. The method of claim 17 which further comprises:

storing specifications and information for a plurality communications protocols compliant with an IEEE 1284 specifications in a hierarchical order and at least one communications protocol compliant with Uniform Serial Bus specifications; and using said stored specifications and information for converting data received in both IEEE 1284 and Uniform Serial Bus communications protocols into comparable data bytes of all of the other communications protocols.

20. The method of claim 19 which further comprises:

determining in which hierarchical order converted data bytes of the plurality of IEEE 1284 communications protocols are transmitted to said peripheral device.

21. The method of claim 19 which further comprises:

ascertaining which communications protocols compliant with IEEE 1284 specifications said peripheral device is capable of using; and determining in which hierarchical order converted data bytes of the plurality of IEEE 1284 communications protocols are to be used when transmitting data to, and receiving data from, said peripheral device; and selecting for use the highest communications protocol compliant with IEEE 1284 specifications from said hierarchical order that said peripheral device is capable of using.

* * * * *